United States Patent
Katayama et al.

(10) Patent No.: US 6,653,685 B2
(45) Date of Patent: Nov. 25, 2003

(54) NONVOLATILE MEMORY DEVICE

(75) Inventors: Kozo Katayama, Kokubunji (JP); Yoshiaki Kamigaki, Takamatsu (JP); Shinichi Minami, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/988,725

(22) Filed: Nov. 20, 2001

(65) Prior Publication Data

US 2002/0074594 A1 Jun. 20, 2002

(30) Foreign Application Priority Data

Nov. 29, 2000 (JP) ........................................ 2000-362667

(51) Int. Cl.⁷ ............................................ H01L 29/792
(52) U.S. Cl. ....................................................... 257/324
(58) Field of Search ................................. 257/324, 315, 257/316, 317, 319, 320, 321; 438/216, 261, 591, 593

(56) References Cited

U.S. PATENT DOCUMENTS 5,768,192 A   6/1998  Eitan .................... 365/185.24
6,388,293 B1 * 5/2002 Ogura et al. ................ 257/365

FOREIGN PATENT DOCUMENTS

JP        2001-156275           6/2001

* cited by examiner

*Primary Examiner*—Thien Tran
(74) *Attorney, Agent, or Firm*—Miles & Stockbridge P.C.

(57) ABSTRACT

A nonvolatile memory device has a plurality of nonvolatile memory cells in which a memory gate electrode is formed over a first semiconductor region with a gate insulating film and a gate nitride film interposed therebetween. First and second switch gate electrodes, and first and second signal electrodes used as source/drain electrodes are formed on both sides of the memory gate electrode. Electrons are injected into the gate nitride film from the source side to store information in the memory cells. The memory gate electrode and the switch gate electrodes extend in the same direction. The application of a high electric field to a memory cell which is not selected for writing can be avoided owing to the switch gate electrodes being held in a cut-off state.

15 Claims, 34 Drawing Sheets

ERASE (BYTE)

FIG. 7 WRITE (CYCLE 1)

FIG. 8 WRITE (CYCLE 2)

READ (CYCLE 1)

READ (CYCLE 2)

(NITRIDE FILM) (OXIDE FILM) (SUBSTRATE)

ERASE (2 BITS)

ERASE (4 BITS)

ERASE (PAGE)

WRITE

READ

NONVOLATILE MEMORY DEVICE

BACKGROUND OF THE INVENTION

The present invention relates to a semiconductor device having nonvolatile memory cells of multi-storage forms, wherein a structure called "a so-called MNOS (Metal Nitride Oxide Semiconductor)" or "MONOS (Metal Oxide Nitride Oxide Semiconductor)" is configured as a base, and electrons are trapped in nitride near the interface between nitride and oxide at physically different positions, thereby making it possible to perform the storage of multi-valued information, an IC card using the semiconductor device, and a method for manufacturing such a semiconductor device. The present invention also relates to, for example, a technology effective for application to a microcomputer for an IC card provided with a nonvolatile memory of a multi-storage form on an on-chip basis.

A nonvolatile memory cell having a MONOS structure has been described in U.S. Pat. No. 5,768,192. According to this, as illustrated in FIGS. 45(A) and 45(B), a gate oxide film 1 and a gate nitride film 2 are laminated on a semiconductor region, and a memory gate electrode 3, which constitutes a word line, is provided thereon. Further, signal electrodes 4 and 5 either of which serves as a source or drain electrode, are formed in the semiconductor region placed under the memory gate electrode. The present nonvolatile memory cell is capable of trapping electrons in the gate nitride film 2 near the interface with the gate oxide film 1 at physically different positions, thereby performing the storage of multi-valued information. The injection of electrons in nitride is carried out according to channel hot electron injection. When one attempts to inject hot electrons into the right end of the gate nitride 2 as shown in FIG. 45(A), the left signal electrode 5 is used as a source (source (W)), and the right signal electrode 4 is used as a drain (drain (W)). Further, a drain current is caused to flow so that the direction indicated by arrow W takes the direction of motion of electrons. Thus, the electrons in a channel are accelerated under a high electric field near the drain and thereby brought into hot electrons, followed by injection into the drain end of the gate nitride film 2. When it is desired to inject hot electrons into the left end of the gate nitride film 2 as shown in FIG. 45(B), the right signal electrode 4 is used as a source (source (W)) and the left signal electrode 5 is used as a drain (drain (W)), and electrons are moved in the direction indicated by arrow W.

When information stored at the right end of the gate nitride film 2 is read as shown in FIG. 45(A), the right signal electrode 4 is used as a source (source (R)) and the left signal electrode 5 is used as a drain (drain (R)), and the memory gate electrode 3 may be set to a select level. Since a depletion layer of a MOS transistor expands into the drain side, the switch state of the memory cell greatly depends on the state of a threshold voltage on the source side. Thus, when information stored at the left end of the gate nitride film 2 is read as shown in FIG. 45(B), the left signal nitride 5 and the right signal electrode 4 are respectively used as a source (source (R)) and a drain (drain (R)) so that the sources and drains are set contrary to FIG. 45(A), and the memory gate electrode 3 may be set to a select level. If an erase state in which the threshold voltage is lower than the gate select level, is taken, then electrons flow in the direction indicated by arrow R.

A plan view of one memory cell is illustrated in FIG. 45(C). F means a minimum processed size. FIG. 46(A) illustrates voltage-applied states necessary for an erase (e.g., electron discharge) operation based on word-line units, FIG. 46(B) illustrates voltage-applied states necessary for an erase operation based on a memory array batch, FIG. 46(C) illustrates voltage-applied states necessary for writing (e.g., injection of electrons), and FIG. 46(D) illustrates voltage-applied states necessary for reading, respectively. In FIGS. 46(A) through 46(D), portions indicated by elliptical circles affixed to the memory cells respectively means regions intended for writing, erasing and reading.

SUMMARY OF THE INVENTION

The prior art is not capable of performing writing in plural bit units. Namely, upon the write operation as illustrated in FIG. 46(C), a bit line 6 is supplied with 3V and a word line 7 is supplied with 6V to carry out hot electron injection. However, if an attempt to carry out byte writing, for example is made, then a write blocking or inhibition voltage of 6V must be applied to the corresponding bit line with respect to a write inhibition bit. In doing so, a large electric field occurs between the bit line and a word line write-unselected at 0V and hence writing is effected on an undesired bit. Since the channel hot-electron injection system is adopted, a write current will increase. Upon the read operation as shown in FIG. 46(D) as well, it is necessary to set a source line for an adjacent memory cell which shares the use of a bit line 6 between a memory cell selected for the read operation and the adjacent memory cell, to floating (F). There is a possibility that the read operation based on such a virtual ground system will be susceptible to the unbalance of parasitic capacity of the source line brought to the floating and the read operation will be unstable.

As one for solving some of the problems, there is known the preceding application (Unexamined Patent Publication No. 2001-156275, U.S. Ser. or application No. 09/660,923) filed by the present applicant. In a nonvolatile memory cell shown in the present application, as illustrated in FIG. 47(A), a gate oxide film 11 and a gate nitride film 12 are laminated on a semiconductor region, and a memory gate electrode 13, which constitutes a word line, is formed thereon. Further, switch gate electrodes 16 and 17 are formed over the semiconductor region on both sides of the memory gate electrode 13 with gate oxide films 14 and 15 interposed therebetween. Signal electrodes 18 and 19 either of which serves as a source or drain electrode, are formed in the semiconductor region lying in the neighborhood below the respective switch gate electrodes 16 and 17. Since the present memory cell is added with the switch gate electrodes 16 and 17, a cell size increases correspondingly as illustrated in FIG. 47(B). Erasing effected on the memory cell is carried out by applying an electric field between the word line (memory gate electrode) and a substrate and drawing electrons into the substrate as illustrated in FIG. 48(A). Writing is carried out by a source side hot-electron injection system. Namely, as illustrated in FIG. 48(B), a word line 20 for a write-selected memory cell is set to a high potential to allow a channel current to flow through the memory cell via an on-state switch gate electrode 16, whereby an electric field is formed between a memory gate electrode 13, and a substrate and a source electrode 18. Thus, when the electrons from the signal electrode 18 used as a source electrode pass through a channel narrowed down by the switch gate electrode 16, they are accelerated and set high in energy. They are further accelerated under a high electric field between the memory gate electrode and the substrate, followed by trapping into the gate nitride film 12 on the signal electrode 18 side used as the source electrode. Since the writing is carried out according to electron source side injection, the source/drain at reading may be the same as at writing. As shown in FIG. 48(C), a signal electrode 19 may be used as a drain and a signal line 21 may be used as a bit line. W in FIG. 47(A) means the direction of injection of electrons at writing, R means the direction of motion of electrons at a read operation, and E means the direction of transfer of electrons at erasure. Incidentally, when the electrons are injected into the gate nitride film 12 on the signal electrode 19 side although not shown in the drawing and thereby stored information is read, voltage conditions may be varied so that the source and drain are changed or reversed. Thus, when the electrons from the signal electrode 18 used as a source electrode pass through a channel narrowed down by the switch gate electrode 16, they are accelerated and set high in energy. They are further accelerated under a high electric field between the memory gate electrode and the substrate, followed by trapping into the gate nitride film 12 on the signal electrode 18 side used as the source electrode. Since the writing is carried out according to electron source side injection, the source/drain at reading may be the same as at writing. As shown in FIG. 48(C), a signal electrode 19 may be used as a drain and a signal line 21 may be used as a bit line. W in FIG. 48(C) means the direction of injection of electrons at writing, R means the direction of motion of electrons at a read operation, and E means the direction of transfer of electrons at erasure. Incidentally, when the electrons are injected into the gate nitride film 12 on the signal electrode 19 side although not shown in the drawing and thereby stored information is read, voltage conditions may be varied so that the source and drain are changed or reversed.

According to the memory cell structure of FIG. 47, since the switch gate electrodes 16 and 17 are provided, the separation of the corresponding memory cell from its adjacent memory cell sharing the use of the source line/bit line is allowed and the source line for the adjacent memory cell may not be set to the floating upon writing or reading. Since the writing is carried out according to the source side hot-electron injection, a write current can also be reduced.

However, the present inventors could find out the following points as a result of further discussions about the memory cell structure. Firstly, rewriting based on plural bit units like byte rewriting cannot be implemented. Namely, a bit line 6 and a word line 7 are respectively supplied with 3V and 6V upon a write operation as illustrated in FIG. 48(B) to perform source side electron injection. However, if an attempt to carry out byte writing, for example is made, then a write blocking or inhibition voltage 6V must be applied to the bit line with respect to a write inhibition bit, and a switch gate electrode which accepts it, must be controlled to a voltage higher than 6V. In doing so, a large electric field occurs between the bit line and a word line write-unselected at 0V, and hence electrons are undesirably injected or discharged with respect to each write-unselected memory cell. Secondly, in the source side electron injection system, electrons from the source side are injected into an insulating film like silicon oxide between a switch gate electrode and a gate nitride film, so that erase/write characteristics are degraded. Thirdly, it has been clearly found out that even the source side electron injection system increase in current consumption as compared with tunnel writing and needs further low power consumption upon application to an IC card or the like supplied with power in non-contact form. Fourthly, it has been clearly found out by the present inventors that because of a configuration using switch gate electrodes, the above memory cell increases in area as compared with each memory cell employed in the channel hot electron injection system, and there is need to provide new means for reducing a chip occupied area as a whole in terms of the layout of each memory cell and a well structure or the like.

An object of the present invention is to implement rewriting based on plural bit units like byte rewriting with respect to a memory using memory cells of multi-storage forms.

Another object of the present invention is to prevent electrons delivered from a source side from being injected into an insulating film between each of switch gate electrode and a gate nitride film and improve rewrite resistance characteristics.

A further object of the present invention is to reduce a write current produced from a source side of a memory cell of a multi-storage form.

A still further object of the present invention is to provide a semiconductor device like a microcomputer or a data processor most suitable for mounting to a non-contact IC card in terms of the consumption of power by an on-chip memory cell of a multi-storage form.

Further, the present invention aims to provide a method capable of relatively easily manufacturing a memory cell of a multi-storage form, which is capable of performing the byte rewriting and is excellent in rewrite resistance characteristics.

The above, other objects, and novel features of the present invention will become apparent from the description of the present specification and the accompanying drawings.

Summaries of typical ones of the inventions disclosed in the present application will be described in brief as follows:

[1] <<Memory cell structure and plural bits writing>>
Each of nonvolatile memory cells of multi-storage forms, which are placed in a semiconductor device, has a configuration wherein a memory gate electrode (33) is formed over a first semiconductor region (30) with first and second gate insulating films (31, 32) interposed therebetween, first and second switch gate electrodes (36, 37) are formed over the first semiconductor region lying on both sides of the memory gate electrode with third gate insulating films (34, 35) interposed therebetween, and first and second signal electrodes (38, 39) each used a source or drain electrode, are formed in the first semiconductor region lying in the neighborhood below the respective switch gate electrodes, and the memory gate electrodes and the switch gate electrodes respectively extend in a first direction.

In the nonvolatile memory cell, the storage of information therein is carried out based on the difference in threshold voltage as viewed from the memory gate electrode according to the amount of carriers, e.g., electrons captured by the second gate insulating film, and the injection of the electrons is allowed according to the source side injection system. For instance, erasing for the nonvolatile memory cell is carried out by applying an electric field between the memory gate electrode and the first semiconductor region to thereby draw electrons from the second gate insulating film to the first semiconductor region. For example, writing is carried out according to the source side injection system. The memory gate electrode is brought to a high potential to allow a channel current to flow into the memory cell through the on-state switch gate electrode, whereby an electric field is formed between the memory gate electrode and the first semiconductor region and signal electrode used as the source. Thus, when the electrons from the signal electrode used as the source electrode pass through a channel narrowed down by the switch gate electrode, they are accelerated and increase in energy. Further, they are accelerated under a high electric field lying between the memory gate electrode and the first semiconductor region, whereby they are obtained by the second insulating film on the signal electrode used as the source electrode.

According to the memory cell structure, since the writing is carried out according to the source side injection, a write current can also be reduced.

In particular, the memory cell structure is adopted wherein the memory gate electrode and the switch gate electrodes are arranged in parallel in the same direction. Therefore, even if a write voltage is applied to the memory gate electrode common for the plurality of memory cells which use the memory gate electrode and switch gate electrodes in common, write and write blocking voltage states can be applied to the respective memory cells through their inherent first and second signal electrodes. If at this time, the switch gate electrodes of memory cells intended for write non-selection, each having the memory gate electrode and switch gate electrodes different from each memory cell intended for writing are respectively brought to a cut-off state, then the application of an undesired high electric field to the second gate insulating film for each memory cell for write non-selection can be blocked. Accordingly, writing can be carried out in units of plural memory cells like byte units.

Types of the storage of the information by the nonvolatile memory cell will be described. The single nonvolatile memory cell stores 2-bit information therein according to a first state (first write state) in which carriers, e.g., electrons are captured on the first switch gate electrode side of the second gate insulating film, a second state (first erase state) in which the electrons captured in the first state are reduced, a third state (second write state) in which electrons are captured on the second switch gate electrode side of the second gate insulating film, or a fourth state (second erase state) in which the electrons captured in the third state are reduced.

Since the threshold voltage of a MOS type transistor is principally placed under the influence of an electrical charge injected into the source side, the source/drain is changed with respect to each memory cell of the multi-storage form to perform a read operation, whereby 2-bit stored information can be obtained from one nonvolatile memory cell back and forth. This can be carried out in the following manner specifically. When a potential at the second signal electrode selected by the second switch gate electrode is set higher than a potential at the first signal electrode selected by the first switch gate electrode, the nonvolatile memory cell can read 1-bit storage information placed in the first or second state. When a potential at the first signal electrode selected by the first switch gate electrode is set higher than a potential at the second signal electrode selected by the second switch gate electrode, the nonvolatile memory cell can read 1-bit storage information placed in the third or fourth state.

[2] <<Memory cell array>> Attention is made to a memory cell array wherein a plurality of the nonvolatile memory cells (MC) are arranged in matrix form. In the memory cell array, the first and second signal electrodes have first and second signal wirings which are respectively connected thereto and extend in a second direction substantially orthogonal to the first direction. The first and second signal wirings are shared between a plurality of nonvolatile memory cells arranged in parallel in the second direction, and the memory gate electrode and switch gate electrodes are commonly used for a plurality of nonvolatile memory cells arranged in parallel in the first direction.

A pair of the nonvolatile memory cells which is adjacent to the first direction and shares the use of the memory gate electrode, may adopt a configuration wherein either one of the first and second signal electrodes is used in common and the others thereof are individualized, and the first and second signal electrodes are connected to their corresponding first and second signal wirings. Thus, the number of the signal wirings can be reduced. Further, this contributes to a reduction in chip occupied area of a memory cell array.

[3] <<Erase>> The first semiconductor region is configured as a well region. Thus, a plurality of the nonvolatile memory cells, which share the use of the memory gate electrode and the first and second switch gate electrodes, are disposed in a plurality of electrically-separated well regions (30m, 30n) in divided form, and each of the nonvolatile memory cells is caused to discharge electrons from the second gate insulating film to the corresponding well region according to the difference in potential between the well region and the memory gate electrode. Thus, electron emission like erasing for the memory cell can be carried out in well region units. If erasing is allowed in well units, then an erase operation is allowed for each byte according to well separation made for each byte. However, when the divided number of well regions increases, well separation regions relatively increase, so that a chip occupied area of a memory cell array increases.

In order to enable the erasing in small number of bit units even if the divided number of well regions is reduced, electrons may be emitted from the second gate insulating film to the first semiconductor region according to the difference in potential between the first or second signal electrode selected by the first or second switch gate electrode and the first semiconductor region. Thus, the erase operation can be carried out in a minimum unit corresponding to the first or second signal electrode.

In order to enable the erasing with the memory gate electrode as a minimum unit, electrons may be emitted from the second insulating film to the memory gate electrode according to the difference in potential between the corresponding signal electrode selected by the first or second switch gate electrode and the memory gate electrode.

[4] <<Low power consumption and improvement in rewrite resistance characteristics>> High-concentration impurity regions (60, 80) are respectively formed in the first semiconductor region placed below the first and second gate insulating films with widths less than or equal to width sizes of the corresponding insulating films. When the electrons are captured on the first switch gate electrode side or second switch gate electrode side of the second gate insulating film, the first semiconductor region is supplied with a backward substrate bias voltage (negative substrate bias voltage in the case of p-type first semiconductor region). Thus, a strong field occurs in the vertical direction (lamination direction) of the first and second gate insulating films in the high-concentration impurity regions, and holes are drawn into the first semiconductor region directly under the high-concentration impurity regions, so that secondary electrons are produced and injected into the second gate insulating film together with electrons supplied from the source. Thus, even if an electric field is low between a memory gate electrode and a source electrode, hot electrons can be produced in a short time and injected into the second gate insulating film. Thus, since a write current to be supplied from the corresponding bit line can be reduced, low power consumption can be promoted and a write time can also be shortened. Besides, since the electric field between the memory gate electrode and the source electrode is small, the probability that electrons will be injected from the source side to an insulating film between a switch gate electrode and the gate nitride film, is also lowered, and the resistance characteristics of rewriting of each memory cell are also improved. Since the high-concentration impurity regions are simply locally provided in the first semiconductor region under the second gate insulating film in particular, a substrate bias voltage can be applied to the first semiconductor region without degradation of junction withstand for the source and drain.

[5] <<Reduction in the number of sense amplifiers>> Since the threshold voltage of the MOS type transistor is principally placed under the influence of the electrical charge injected into the source side as described above, the source/drain is changed to perform a read operation, whereby 2-bit stored information can be obtained from one nonvolatile memory cell back and forth. From the viewpoint of the property that the source/drain is changed to perform the read operation, sense amplifiers for detecting read information may separately be provided in association with the first and second signal electrodes of each memory cell. Judging from the viewpoint of the reduction in chip occupied area, a configuration may be adopted wherein each sense amplifier shares the use of both the first and second signal electrodes of each memory cell. For example, the sense amplifiers are selectively switched and connected to the signal electrode used as the source upon the read operation. Alternatively, a first signal wiring is connected to the first signal electrode of the nonvolatile memory cell, a second signal wiring is connected to the second signal electrode of the nonvolatile memory cell. Further, a precharge circuit (53) capable of precharging the first signal wiring and the second signal wiring, a sense amplifier (50) which detects a change in the level of the first signal wiring, and a control circuit (54, 104) are provided. The control circuit may allow the precharge circuit to perform a precharge operation so that either the first signal electrode or the second signal electrode and the other thereof are respectively brought to a high potential and a low potential according to a read address, and cause the sense amplifier to detect the presence or absence of a change in the level of the first signal wiring after the completion of the precharge operation.

[6] <<IC card>> A semiconductor device on which the nonvolatile memory cells of multi-storage forms are mounted, can be implemented as a data processing LSI such as a microcomputer, a data processor or the like, a system LSI which implements system on-chip for particular application, or a nonvolatile memory LSI. When, for example, the data processing LSI such as the microcomputer or the data processor or the like is considered, the semiconductor device can comprise a memory circuit (MEM) provided with the nonvolatile memory cells as storage elements, a CPU (110) capable of accessing the memory circuit, and an external interface circuit (113) connected to the CPU, all of which are provided on a single semiconductor chip.

If such a semiconductor device is used as a microcomputer for an IC card, the IC card can comprise the semiconductor device, and a card interface terminal connected to the external interface circuit of the semiconductor device, all of which being provided on a card substrate. In the case of a non-contact IC card, an antenna is provided on the card substrate. For example, the transfer of power by an ac magnetic field and communications based on electromagnetic induction can be done in non-contact form. Alternatively, both the power transfer and the information communications may be carried out by the electromagnetic induction. Only the power transmission may be carried out in non-contact form.

[7] <<Manufacturing method of semiconductor device>> The invention according to an aspect of a method of manufacturing a memory device structure having high-concentration impurity regions in a first semiconductor region directly below a second gate insulating film in each of the nonvolatile memory cells of the multi-storage forms is roughly divided into a first manufacturing method for introducing a high-concentration impurity into a first semiconductor region with a memory gate electrode as a mask, and a second manufacturing method for introducing a high-concentration impurity into a first semiconductor region with switch gate electrodes as masks.

The first manufacturing method includes (a) a step of forming a first conductivity type (p-type) first semiconductor region (30) on a main surface of a semiconductor substrate, (b) a step of forming a first insulating film and a second insulating film on the main surface of the semiconductor substrate on the first semiconductor region in order, (c) a step of forming a first conductor element (memory gate electrode) having a first width as viewed in a first direction of the main surface of the semiconductor substrate and a second width as viewed in a second direction substantially orthogonal to the first direction, on the second insulating film, (d) a step of introducing a first impurity (p type: B) of the first conductivity type into the first semiconductor region below the first conductor element as viewed in the first direction to selectively form second semiconductor regions (high-concentration impurity regions 60), (e) a step of forming a third insulating film on side walls of the first conductor element as viewed in the first direction, (f) a step of forming second and third conductor elements (switch gate electrodes) respectively having a third width as viewed in the first direction and a fourth width as viewed in the second direction at both ends of the first conductor element as viewed in the first direction with the third insulating film interposed therebetween, and (g) a step of introducing a second impurity of a second conductivity type (n-type) opposite to the first conductivity type as viewed in the first direction to form a third semiconductor region (source/drain) within the first semiconductor region on the sides opposite to the first conductor element, of the second and third conductor elements.

The second semiconductor region forming step further includes a step of introducing a third impurity (n-type: As) of the second conductivity type into the first semiconductor region at both ends of the first conductor element. The third impurity may be ion-implanted at a first angle to the main surface of the semiconductor substrate, the first impurity may be ion-implanted at a second angle to the main surface of the semiconductor substrate, and the first angle may be set larger than the second angle. Thus, even if the second semiconductor regions used as the high-concentration impurity regions formed of the first impurity protrude outside from both ends in the first direction, of the first conductor element, the impurity concentration of the overflowing or protruded portion can be modified later, whereby the second semiconductor regions can be fabricated with high accuracy.

The second width of the first conductor element may be set greater than the first width, the fourth width of the second conductor element may be set greater than the third width, and the first and second conductor elements may extend in the second direction. Thus, the fabricated memory cells can be rewritten in plural bit units like the byte units as described above.

The first insulating film may comprise silicon oxide, and the second insulating film may comprise silicon nitride.

The second manufacturing method includes (a) a step of forming a first conductivity type (p-type) first semiconductor region (30) on a main surface of a semiconductor substrate, (b) a step of forming two first conductor elements (switch gate electrodes) having a first width as viewed in a first direction of the main surface of the semiconductor substrate and a second width as viewed in a second direction substantially orthogonal to the first direction, on the first semiconductor region with a predetermined interval interposed therebetween, (c) a step of forming a first insulating film on side walls of the first conductor element in a region between the first conductor elements, (d) a step of introducing a first impurity (p-type: B) of the first conductivity type within the first semiconductor region in the region lying between the first conductor elements and interposed by the first insulating film formed on the side walls of the first conductor element in order to form a second semiconductor region (high-concentration impurity region 80) therewithin, (e) a step of forming a second insulating film and a third insulating film over the surface of the semiconductor substrate in the region between the first conductor elements, (f) a step of forming a second conductor element (memory gate electrode) having a third width as viewed in the first direction and a fourth width as viewed in the second direction, on the third insulating film, and (g) a step of introducing a second impurity (n-type) of a second conductivity type opposite to the first conductivity type as viewed in the first direction to form a third semiconductor region (source/drain) within the first semiconductor region on the side opposite to the second conductor element, of the first conductor element.

In the second manufacturing method, the first insulating film forming step may include a step of depositing an insulating film on the semiconductor substrate, and a step of subjecting the insulating film to anisotropic etching and selectively leaving the insulating film on the side walls of the first conductor element.

The second conductor element may be formed on the side walls of the first conductor element with the third insulating film interposed therebetween. The second insulating film may comprise silicon oxide, and the third insulating film may comprise silicon nitride.

The second width of the first conductor element may be set greater than the first width, the fourth width of the second conductor element may be set greater than the third width, and the first and second conductor elements may extend in the second direction. Each of the memory cells fabricated in this way is capable of performing batch writing or the like in plural bit units like the byte units as described above.

DETAILED DESCRIPTION OF THE INVENTION

Preferred embodiments of the present invention will hereinafter be described in detail with reference to the accompanying drawing.

<<MONOS Memory Cell Structure>>

Figure 1A:
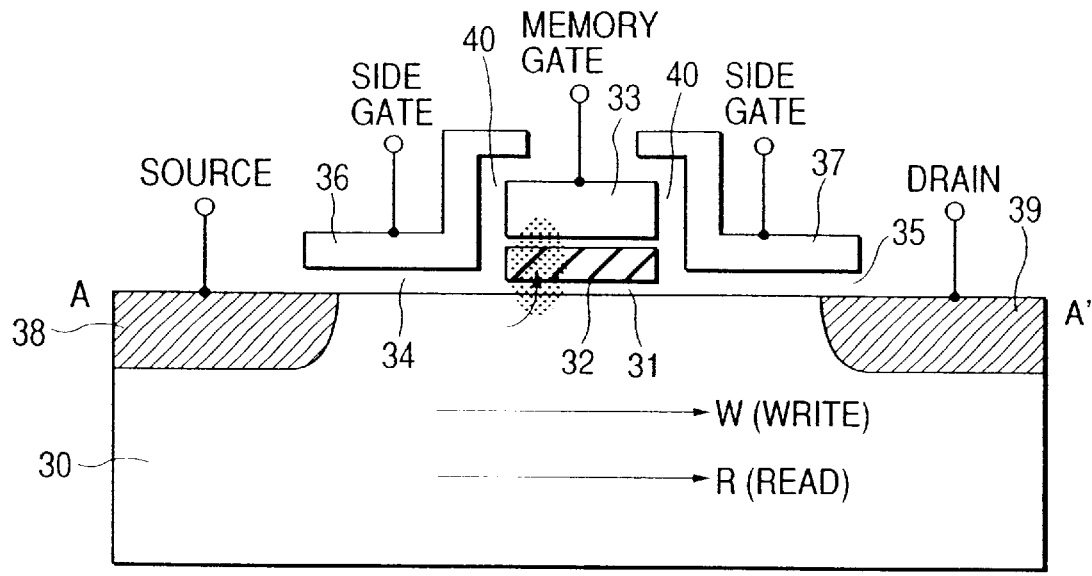
FIGS. 1(A) and 1(B) are vertical cross-sectional views illustrating a nonvolatile memory cell according to the present invention.
Figure 1B:
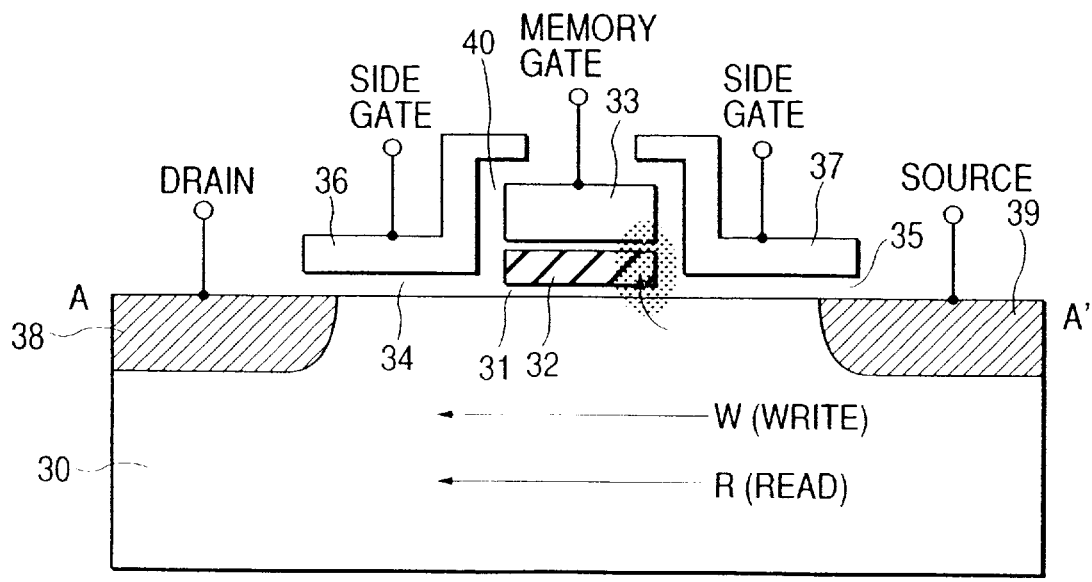
Figure 2:
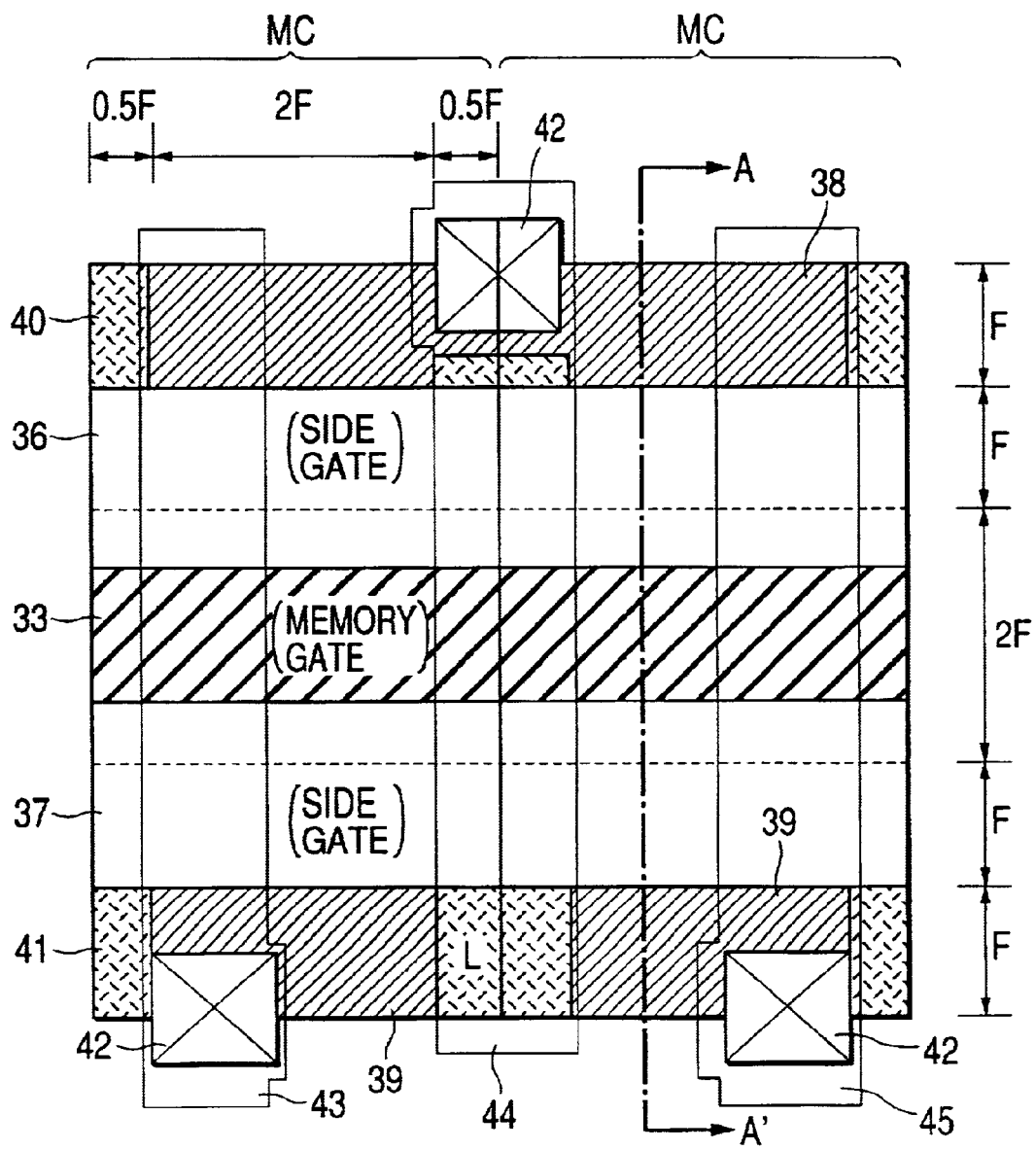
FIG. 2 is a plan layout diagram of the nonvolatile memory cell shown in FIG. 1.

A vertical cross-sectional view of a nonvolatile memory cell according to the present invention is illustrated in FIG. 1. A plan layout of the nonvolatile memory cell is illustrated in FIG. 2. FIG. 1 is a cross-sectional view taken along line A–A' of FIG. 2 and shows two types of states (A) and (B) different in the position of electron injection by a source side injection system. The nonvolatile memory cell shown in the same drawing is capable of storing 2-bit information according to injected positions of electrons from the source side in singular form.

In the nonvolatile memory cell illustrated in FIG. 1, a gate oxide film 31 and a gate nitride film 32 are laminated over a semiconductor region, e.g., a p-type well region 30, and a memory gate electrode (memory gate) 33, which constitutes a word line, is formed thereon. Switch gate electrodes (side gates) 36 and 37, which constitute switch control lines, are respectively formed over the semiconductor regions placed on both sides of the memory gate electrode 33 with the gate oxide films 34 and 35 interposed therebetween. Signal electrodes 38 and 39, either of which serves as a source or drain electrode, are formed within the semiconductor regions lying in the neighborhood below the switch gates 36 and 37. An interlayer insulating film 40 is interposed between the gate nitride film 32 and memory gate electrode 33 and the switch gate electrodes 36 and 37.

Erasing for the nonvolatile memory cell is carried out by, for example, applying an electric field between the memory gate electrode 33 and the well region 30 to thereby draw electrons into the well region 30. Writing is carried out according to a source side hot electron injecting system. In FIG. 1(A) by way of example, the memory gate electrode 33 is brought to a high potential to allow a channel current to flow into the memory cell through the on-state switch gate electrode 36, whereby an electric field is formed between the memory gate electrode 33 and the well region 30 and source electrode 38. Thus, when the electrons from the signal electrode 38 used as the source electrode pass through a channel narrowed down by the switch gate electrode 36, they are accelerated and increase in energy. Further, they are accelerated under a high electric field lying between the memory gate electrode 33 and the well region 30, whereby they are obtained from the signal electrode 38 side used as the source electrode so as to reach the gate nitride film 32. Since the writing is performed according to the injection of the electrons from the source side, the source and drain at reading may be the same as at writing, the signal electrode 39 may be configured as the drain, and the signal electrode 38 may be configured as the source. FIG. 1(A) assumes a case in which the electrons are injected into the left side of the silicon nitride film, and FIG. 1(B) assumes a case in which the electrons are injected into the right side of the silicon nitride film. In the drawing, W means the direction of injection of the electrons at a write operation, and R means the direction of motion of the electrons at a read operation.

When the nonvolatile memory cell shown in FIG. 1 is manufactured, a field oxide film 41 is first formed on a silicon substrate and thereafter a gate oxide film 31 is formed in a memory cell region. Further, a gate nitride film 32 formed of silicon nitride is formed on the gate oxide film 31. Polysilicon corresponding to a first layer is processed to form a memory gate electrode (word line) 33 on the gate nitride film 32. After the gate oxide film 31 and gate nitride film 32 corresponding to exposed portions are removed, gate oxide films 34 and 35 and interlayer insulating film 40 used for switch gate electrodes are formed. Thereafter, polysilicon corresponding to a second layer is deposited to thereby form the switch gate electrodes 36 and 37 in parallel with the memory gate electrode (word line) 33. Ions are injected into the silicon substrate with the memory gate electrode 33 and the switch gate electrodes 36 and 37 as masks to thereby form signal electrodes 38 and 39 either of which is formed as a source or drain electrode. Thereafter, an interlayer insulating film is deposited over the entire surface and contact holes 42 are defined therein. Further, a metal such as aluminum or the like is deposited to form data lines 43, 44 and 45 used as signal wirings.

The plan layout of FIG. 2 is shown with the two nonvolatile memory cells MC provided from side to side as minimum units. One signal electrode 38 is commonly used in both the memory cells MC and connected to the data line 44. The other signal electrodes 39 are individualized according to the two memory cells MC and respectively connected to the discrete data lines 43 and 45. As is apparent from FIG. 2, the memory gate electrodes 33 and the switch gate electrodes 36 and 37 extend in the direction substantially orthogonal to the data lines.

Figure 3:
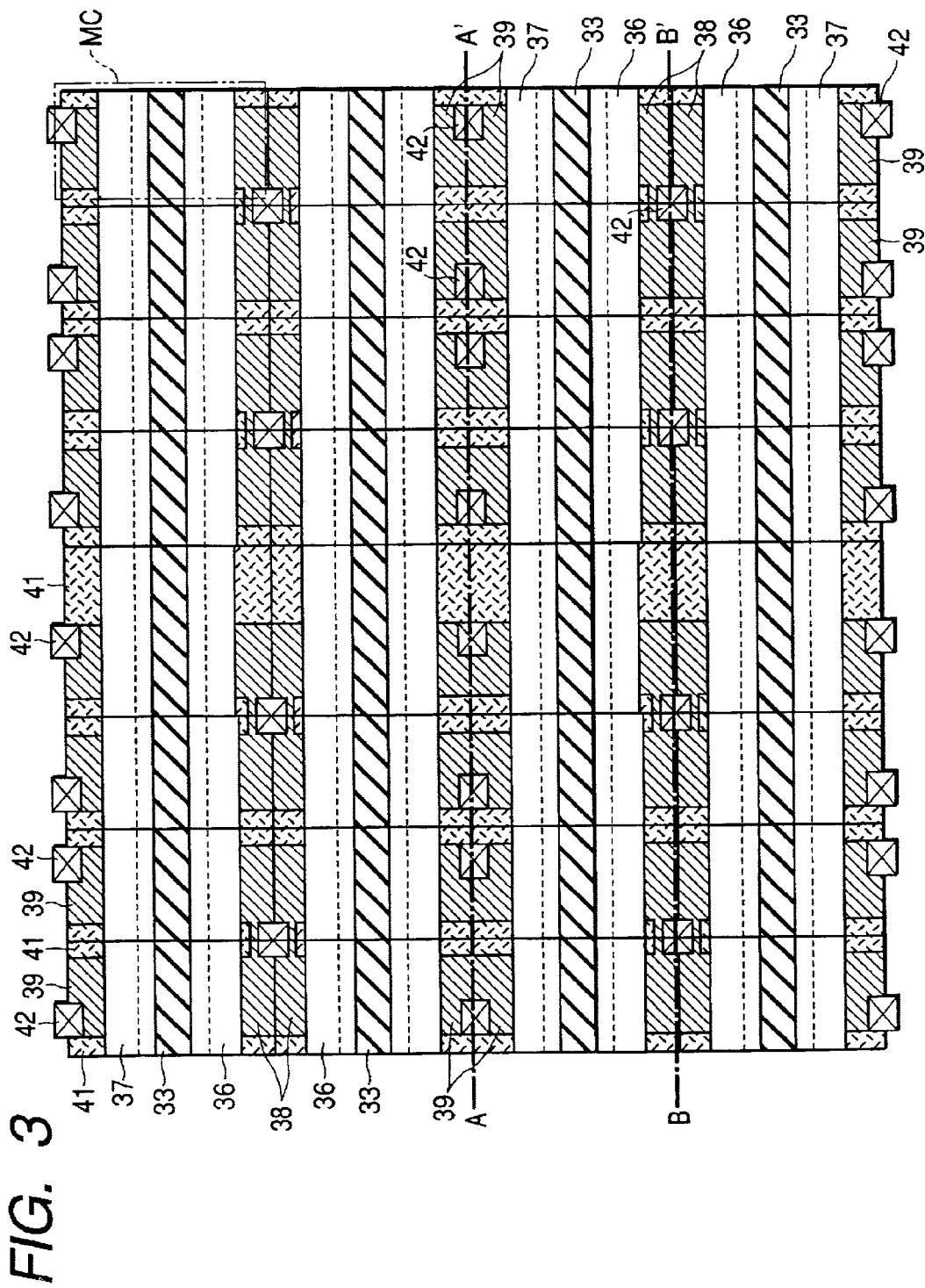
FIG. 3 is a plan layout diagram of a memory cell array in which a memory cell layout represented in a minimum unit in FIG. 2 is developed plural times.

A configuration in which the memory cell layout corresponding to the minimum unit shown in FIG. 2 is set to plural times, is illustrated in FIG. 3. Since the memory cell layout corresponding to the minimum unit of FIG. 2 is equivalent to a 4-bit one-word configuration, FIG. 3 results in a configuration wherein circuit blocks corresponding to 8-bit-based 4 words are disposed as two pairs. The memory gate electrodes 33 adjacent to one another in the transverse direction are connected to one another to constitute the word lines, and the switch gate electrodes 36 and 37 adjacent to one another in the transverse direction are connected to one another to constitute switch control lines.

As shown in FIGS. 2 and 3, the adoption of the configuration in which one signal electrode 38 is commonly used for an adjacent pair of the nonvolatile memory cells MC using the memory gate electrode 33 in common, and the other signal electrodes 39 are individualized with respect to the nonvolatile memory cells MC and connected to their corresponding data lines 43, 44 and 45, allows a reduction in the number of the data lines and a reduction in chip occupied area of a memory cell array.

Figure 4:
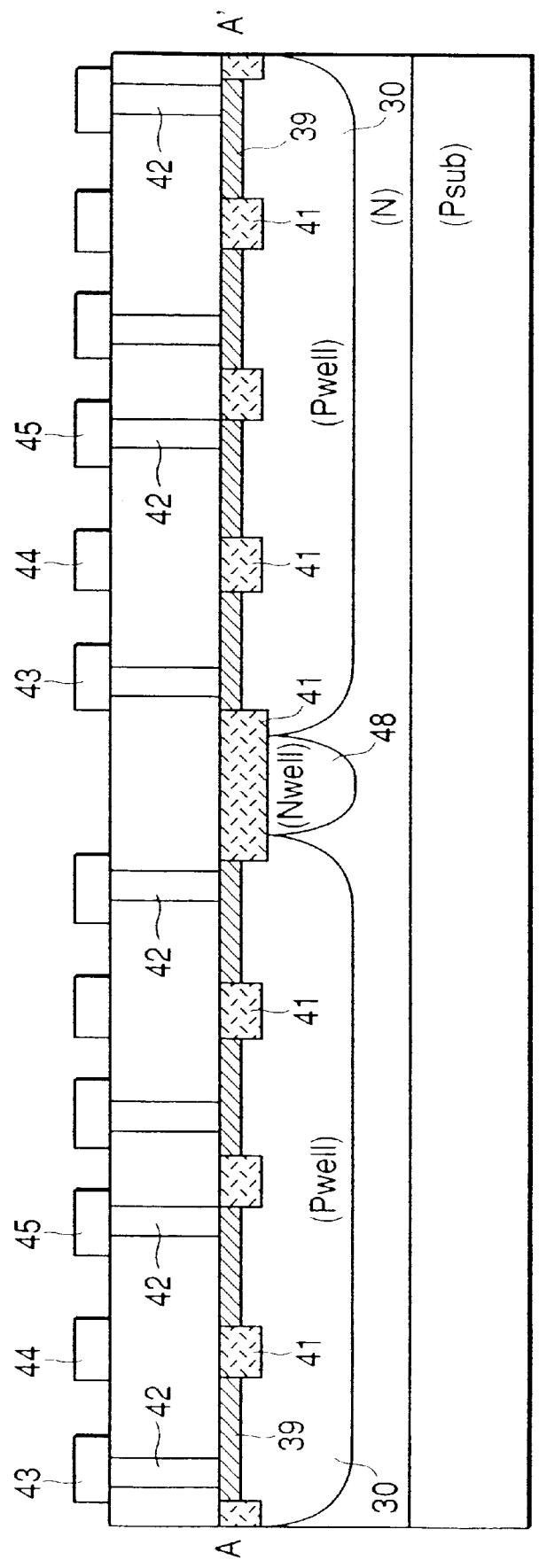
FIG. 4 is a cross-sectional view taken along line A–A' of FIG. 3.
Figure 5:
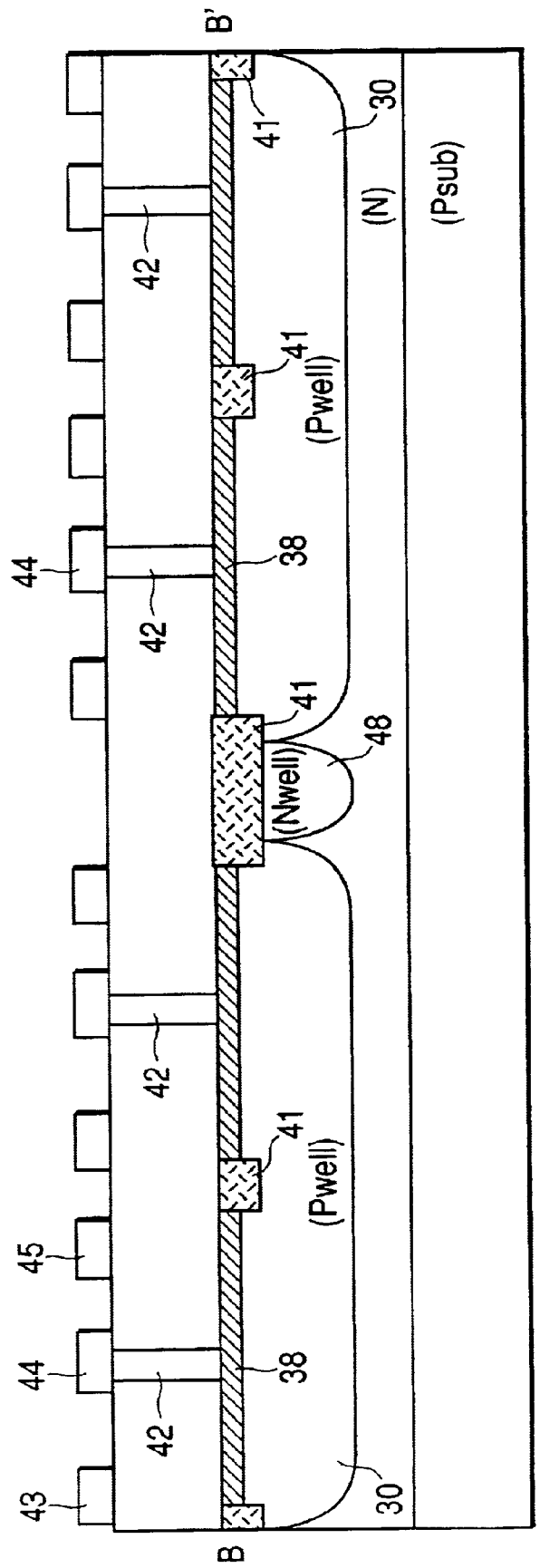
FIG. 5 is a cross-sectional view taken along line B–B' of FIG. 3.

FIG. 4 shows a cross-section taken along line A–A' of FIG. 3, and FIG. 5 illustrates a cross-section taken along line B–B' of FIG. 3, respectively. In the configurations shown in FIGS. 4 and 5, p-type well regions (Pwell) 30 are formed every 8 bits per word, and an n-type well region (Nwell) 48 separates between the two.

<<Erase.Write.Read>>

Figure 6:
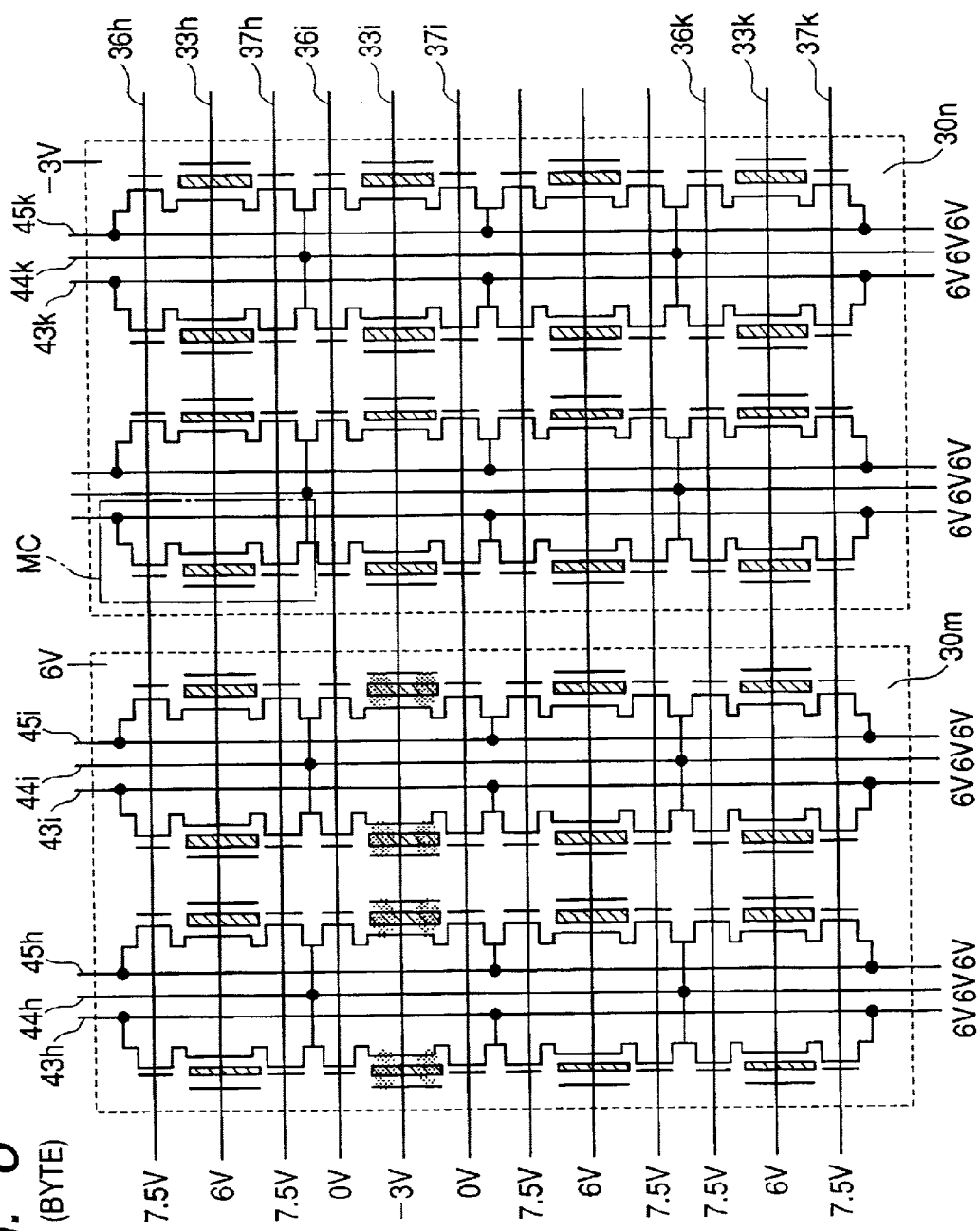
FIG. 6 is a circuit diagram illustrating a circuit configuration corresponding to layout patterns shown in FIG. 3 together with a voltage-applied state for an erase operation.

FIG. 6 shows a circuit configuration corresponding to the layout patterns shown in FIG. 3 and illustrates voltage-applied states for an erase operation in particular. For the convenience of description herein, the extended memory gate electrodes 33 are added with suffixes of h, i, j and k so as to be represented as word lines 33$h$ through 33$k$. The extended switch gate electrodes 36 and 37 are respectively represented as switch control lines 36$h$, 37$h$ through 36$k$ and 37$k$, and the extended data lines 43, 44 and 45 are respectively represented as data lines 43$h$, 44$h$, 45$h$ through 43$k$, 44$k$ and 45$k$. Similarly, the p-type well regions 30 are respectively marked with suffixes m and n so as to be represented as p-type well regions 30$m$ and 30$n$.

The erase operation can be carried out every well regions 30$m$ and 30$n$ in units of word lines 33h through 33$k$. In FIG. 6, source side regions added with elliptic marks, of the nonvolatile memory cell are intended for erasing. For example, a positive high voltage Vpp (6V) is applied to all the data lines 43$h$, 44$h$, 45$h$ through 43$k$, 44$k$ and 45$k$, the word lines 33$h$, 33$j$ and 33$k$ lying in non-erasure rows, and the well region 30$m$ intended for erasing, and a negative voltage –Vpw (–3V) is applied to the word line 33$i$ intended for erasure and the well region 30$n$ for non-erasure. 0V is applied to the switch control lines (side gates) 36$i$ and 37$i$ lying in the erasure rows, and a Vpp'>Vpp+Vth of (7.5V) is applied to both side gates 36$h$, 37$h$, 36$j$, 37$j$, 36$k$ and 37$k$ lying in the non-erasure rows. Here, Vth means the threshold voltage of a side gate transistor which comprises the switch gate electrodes 36 and 37.

Thus, a potential difference (9V) of Vpp+Vpw is applied between the memory gate electrode 33 of each of memory cells having bytes intended for erasure, which are connected to the word line 33$i$ in the well region 30$m$, and the substrate (well region), and electrons are drawn into the silicon substrate (well region 30$m$) from within the silicon nitride film 32 and at the same time positive holes are injected into the silicon nitride film 32, whereby each of the memory cells is brought to an erase state. The threshold voltage as viewed from the memory gate electrode is lowered in this erase state and although not restricted in particular, each memory cell is configured so as to take a depletion type herein. An erase time may be taken long to deplete each memory cell. However, it is convenient if an impurity concentration for the well region is controlled in advance in a wafer process stage. In each non-selected memory cell other that the above on the other hand, 6V are supplied to a channel from the data lines 43, 44 and 45 through the switch gate electrodes 36 and 37 to thereby suppress erasing.

Figure 7:
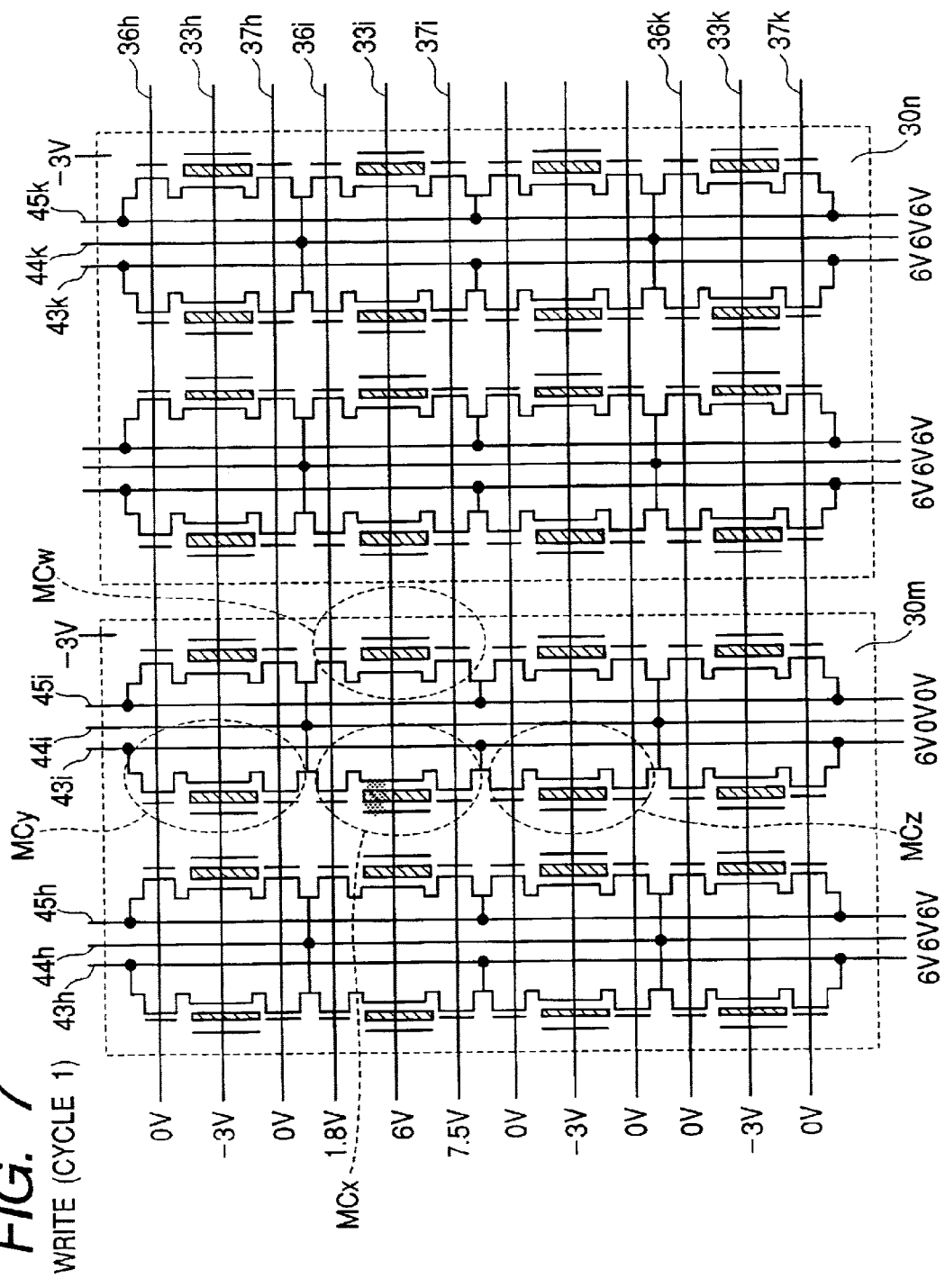
FIG. 7 is a circuit diagram illustrating a case in which data is written into the source side on the switch gate 36 side, as a voltage-applied state necessary for a write operation in the circuit configuration shown in FIG. 6.
Figure 8:
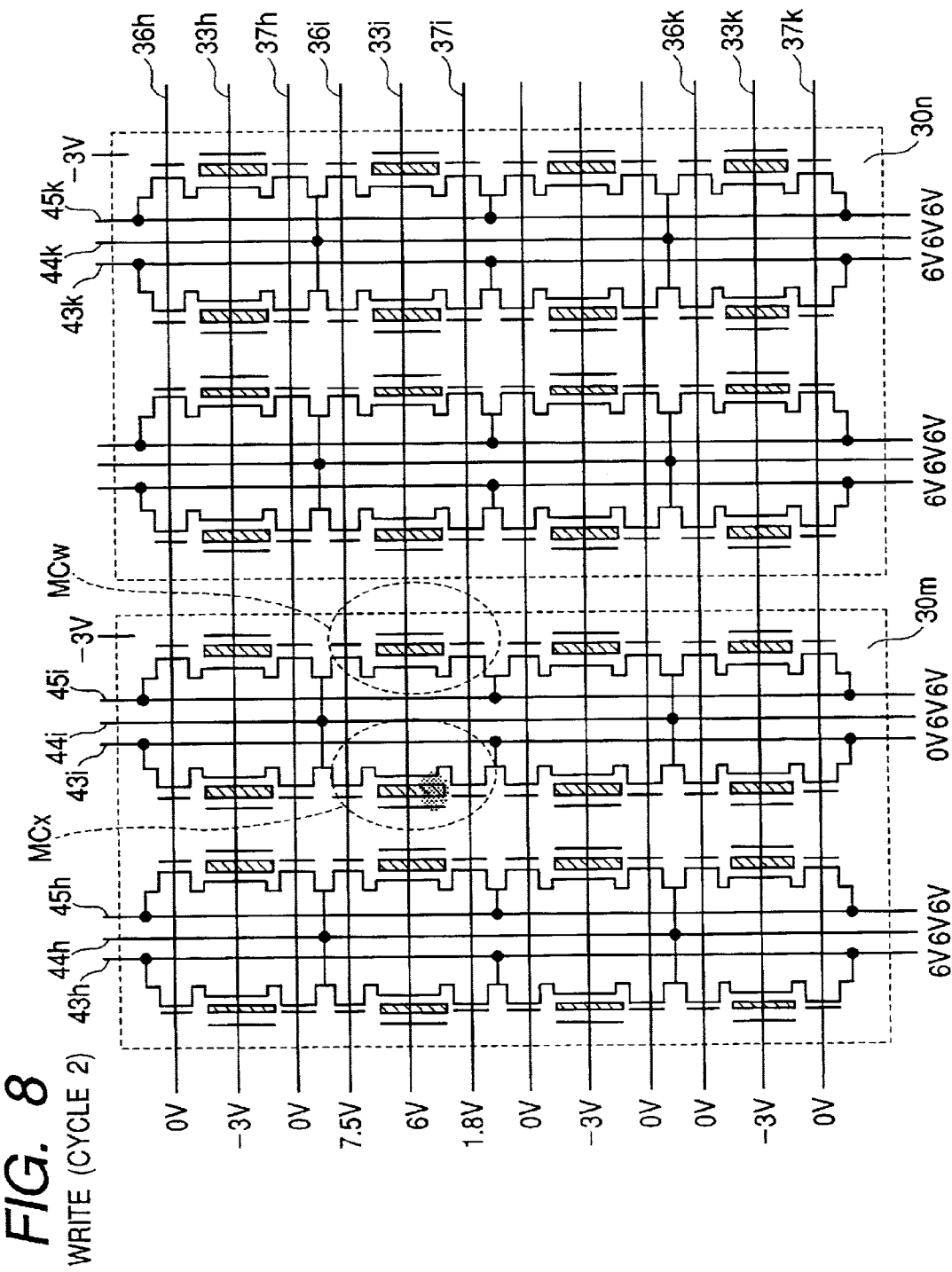
FIG. 8 is a circuit diagram illustrating a case in which data is written into the source side on the switch gate 37 side, as a voltage-applied state necessary for a write operation in the circuit configuration shown in FIG. 6.

Voltage-applied states necessary for a write operation in the circuit configuration shown in FIG. 6 are illustrated in FIGS. 7 and 8. FIG. 7 shows a case in which writing is effected on the source side on the switch gate 36 side, and FIG. 8 shows a case in which writing is effected on the source side on the switch gate 37 side.

In the case shown in FIG. 7, the well regions 30m and 30n and the word lines 33h, 33j and 33k lying in the non-selected rows are maintained at −Vpw (−3V), and the switch control lines 36h, 37h, 36j, 37j, 36k and 37k are held at 0V. Further, Vpp (6V) are applied to the data lines 43h, 44h, 45h, 43j, 44j, 45j, 43k, 44k and 45k lying in the non-selected columns. The word line 33i lying in the selected row is set to Vpp, the data lines 44i and 45i lying in the selected columns are set to 0V, the data line 43 lying in the selected column is set to 6V, the switch control line 36i connected to the source side of each selected memory cell is set to Vps (1.8V), and the switch control line 37i connected to the drain side of each selected memory cell is set to Vpp' (7.5V), respectively.

An object to be written under the above voltage conditions is set as the source side marked with an elliptical circle, of the gate nitride film for the corresponding memory cell MCx. In the source side thereof, electrons flow into the channel narrowed down by the switch control line 36i through the data line 44i and are accelerated and injected under a high potential applied to the memory gate electrode 33i. Vps is set slightly higher than the threshold voltage of the side gate transistor comprising the switch gate electrode 36, whereby low current-based writing is implemented.

In a memory cell MCw adjacent to the written memory cell Cx, sharing the use of the word line 33i and the data line 44i in FIG. 7, the data line 45i is set to 0V so that the supply of a channel current is cut off, thereby inhibiting writing. If it is desired to effect the writing on the same source side as the memory cell MCx even with respect to the memory cell MCw, then the data line 45i may be controlled to 6V. On the other hand, even if the memory cell MCx to be written and the data lines 43i and 44i are shared, memory cells MCy, MCz, . . . different in word line and switch control line are controlled to 0V so that channels and data lines are brought into non-conduction through their switch control lines. Therefore, even if any voltage is applied to the data lines 43i and 44i, their non-conducting states are maintained. Thus, a plurality of memory cells sharing the use of the word lines and switch control lines can collectively effect writing and write blocking on the same source side. In short, writing can be carried out in units of plural bits like bytes.

In the case of FIG. 8 showing a case in which electrons are injected from the source side placed on the side below the memory cell MCx, the potentials on the switch control lines 36i and 37i are rendered opposite to FIG. 7 to change or reverse its source/drain, and the potentials on the data lines 43i and 44i are set in reverse to FIG. 7. Since the memory cell MCw adjacent to the memory cell MCx, which shares the use of the data line 44i, is blocked from writing in FIG. 8, the data line 45i is set to 6V identical in potential to the data line 44i.

Figure 9:
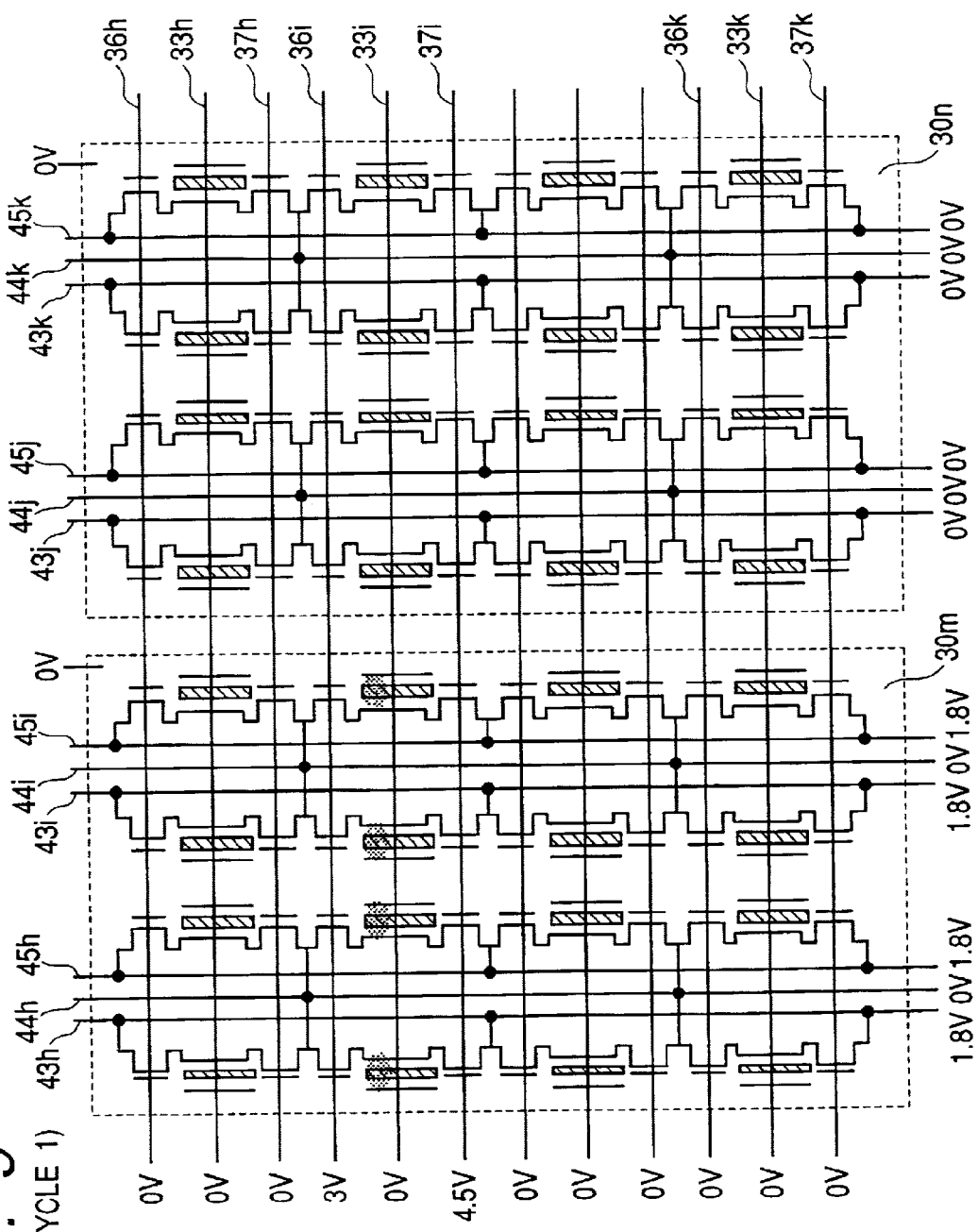
FIG. 9 is a circuit diagram illustrating a case in which information stored in the source side on the switch gate 30 side is read, as a voltage-applied state necessary for a read operation in the circuit configuration shown in FIG. 6.
Figure 10:
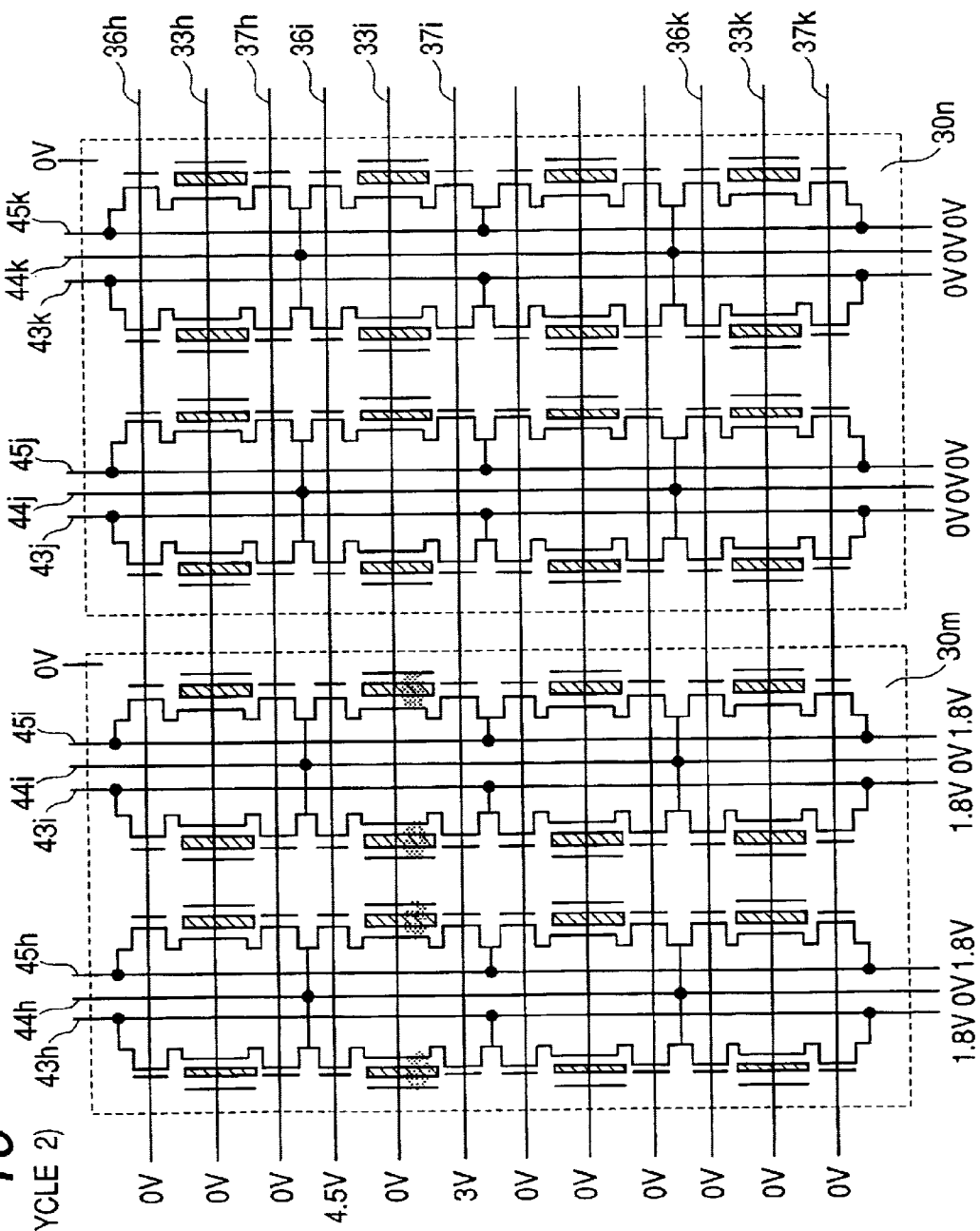
FIG. 10 is a circuit diagram illustrating a case in which information stored in the source side on the switch gate 37 side is read, as a voltage-applied state necessary for a read operation in the circuit configuration shown in FIG. 6.

Voltage-applied states necessary for a read operation in the circuit configuration shown in FIG. 6 are illustrated in FIGS. 9 and 10. FIG. 9 shows a case in which information stored in the source side on the switch gate 36 side is read, and FIG. 10 illustrates a case in which information stored in the source side on the switch gate 37 side is read.

In FIGS. 9 and 10, the well regions 30m and 30n, all the word lines 33h through 33k, the switch control lines 36h, 37h, 36j, 37j, 36k and 37k lying the non-selected rows, and the data lines 43j, 44j, 45j, 43k, 44k and 45k lying in the non-selected column are respectively set to 0V. In the case of FIG. 9 showing the case in which the information stored in the source side on the switch gate 36 side, a VR of (−1.8V) is applied to the data lines 43h, 45h, 43i and 45i, 0V is applied to the data lines 44h and 44i, a VRS of (3V) is set to the switch control line 36i, and a VRD of (4.5V) is set to the switch control line 37i respectively. Consequently, voltage states are formed in which the positions of four memory cells, which are indicated by elliptical circles, are brought to the sources, and the sides opposite thereto are brought to the drains. If electrons have already been injected (written) into each source side marked with the elliptical circle in FIG. 9 at this time, then no current flows from the drain to the source. If the electrons have already been discharged (erased), then the current flows from the drain to the source. This difference is detected by a sense amplifier to be described later, and a logic value of read data is determined. In the case of FIG. 10 showing the case in which the information stored in the source side on the switch gate 37 side is read, the voltages applied to the data lines 43h, 44h, 45h, 43i, 44i and 45i and the switch control lines 36i and 37i may be switched so that the sources/drains are changed.

When the switching gate control-line voltage VRD on each drain side is set high upon the read operation, a channel potential on the drain side is fixed by VRD and a drain voltage and hence the influence of an electrical charge stored in the gate nitride film 32 is not so exerted thereon, thereby making it possible to increase a reading margin in a charge injection/discharge state on the source side.

<<Write.Read System Circuit>>

Figure 11:
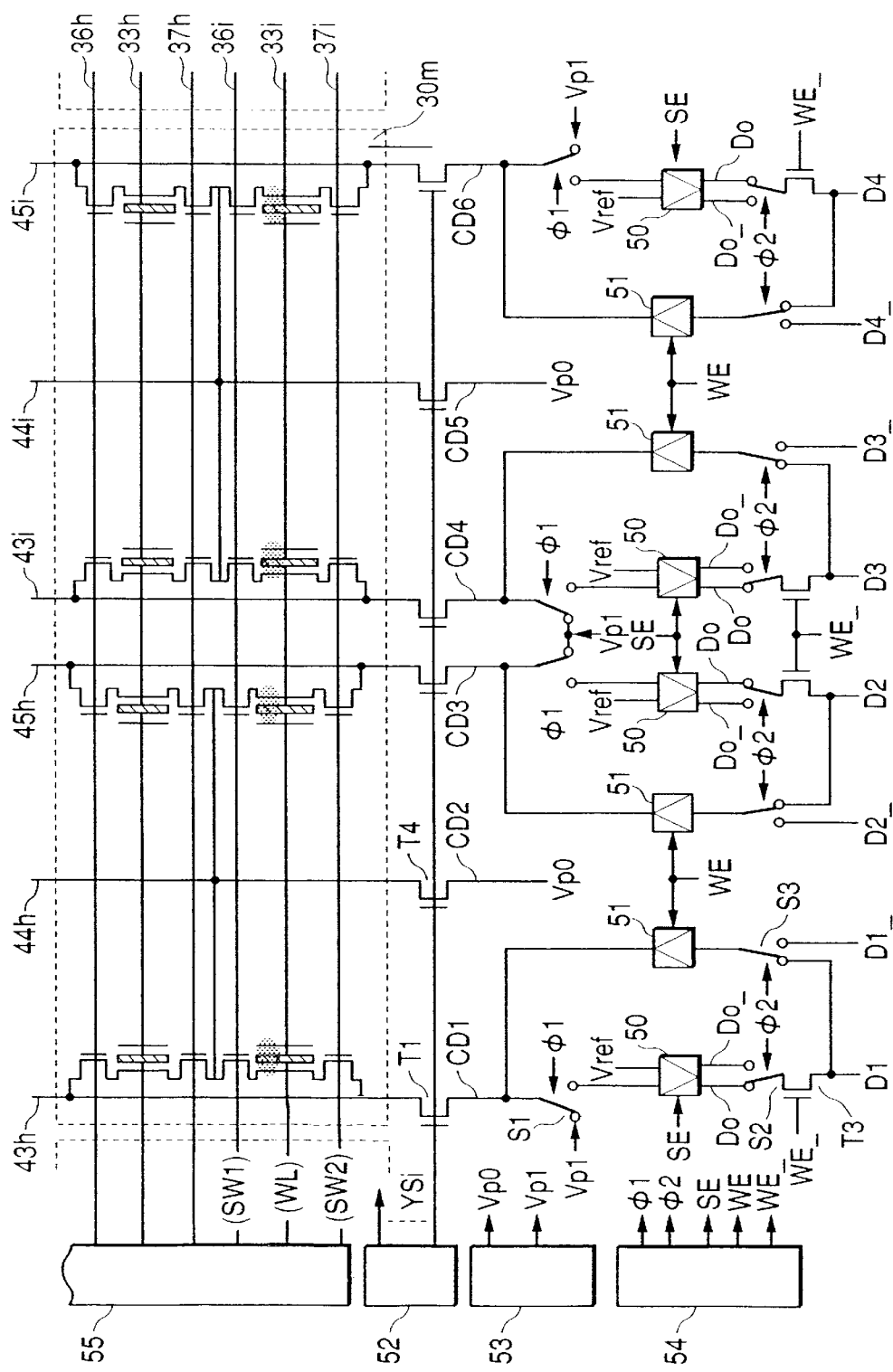
FIG. 11 is a circuit diagram illustrates write and read minimum unit circuits in byte units and illustrating modes of connections of sense amplifiers and write amplifiers at the assumption of write and read operations (cycle 1) with respect to the source sides of FIGS. 7 and 9.
Figure 12:
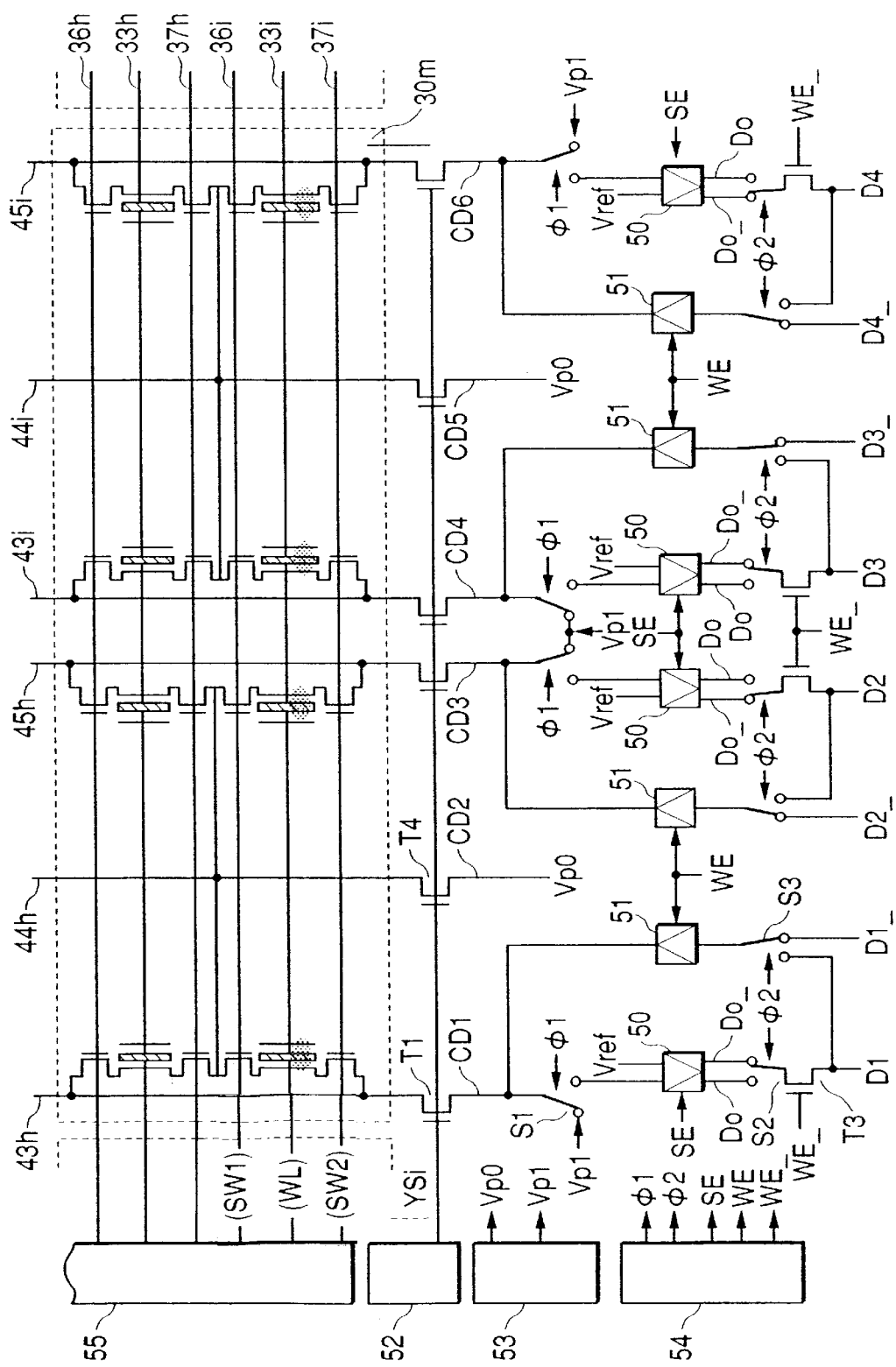
FIG. 12 is a circuit diagram illustrating write and read minimum unit circuits in byte units and illustrating modes of connections of sense amplifiers and write amplifiers at the assumption of write and read operations (cycle 2) with respect to the source sides of FIGS. 8 and 10.

Write and read minimum unit circuits set in byte units are illustrated in FIGS. 11 and 12 respectively. FIG. 11 illustrates modes of connections of sense amplifiers and write amplifiers at the assumption of write and read operations (cycle 1) with respect to the source sides of FIGS. 7 and 9. FIG. 12 illustrates modes of connections of sense amplifiers and write amplifiers at the assumption of write and read operations (cycle 2) with respect to the source sides of FIGS. 8 and 10.

Column switches T1 for data lines 43h, 45h, 43i and 45i and column switches T4 for data lines 44h and 44i are respectively switch-controlled by a column select signal 45i represented in byte units. Although not shown in the drawings, column switches based on byte units are provided even with respect to other data lines. These column switches are connected to their corresponding common data lines CD1 through CD6 in byte units. The column select signal 45i is generated from a column decoder 52. Signals for driving a word line typified by 33i and switch gate control lines typified by 36i and 37i are generated by a row decoder 55.

Sense amplifiers 50 and write amplifiers 51 are placed in association with the partial common data lines CD1, CD3, CD4 and CD6. A selective voltage Vp0 can be precharged to each of the common data lines CD2 and CD5. A configuration related to the common data line CD1, for example will be described as a typical one. The common data line CD1 can be precharged by a selective voltage Vp1 through a selector S1 or connected to an input terminal of the sense amplifier 50 through the selector S1. When the operation of the sense amplifier 50 is instructed by an activation signal SE, the sense amplifier 50 differentially amplifies a signal corresponding to a difference voltage of an input signal with respect to a reference level Vref and outputs the amplified signal. An inverted output $D_{0\_}$ of the differentially-amplified signal or a non-inverted output $D_0$ thereof is selected by a selector S2, which in turn is outputted as a signal D1 through an output gate T3. A non-inverted signal D1 or an inverted signal $D1\_$ is selected by an input selector S3, which in turn is supplied to the write amplifier 51. The write amplifier 51 is activated by a control signal WE to drive the common data line CD1 according to the data inputted thereto. φ1 indicates a select signal for the selector S1, and φ2 indicates a select signal for the selectors S2 and S3. Reference numeral 53 indicates a precharge circuit for forming voltages Vp0 and Vp1 according to operations, and reference numeral 54 indicates a timing generator for generating the control signals φ1, φ2, SE, WE, WE_, etc., respectively.

Figure 13:
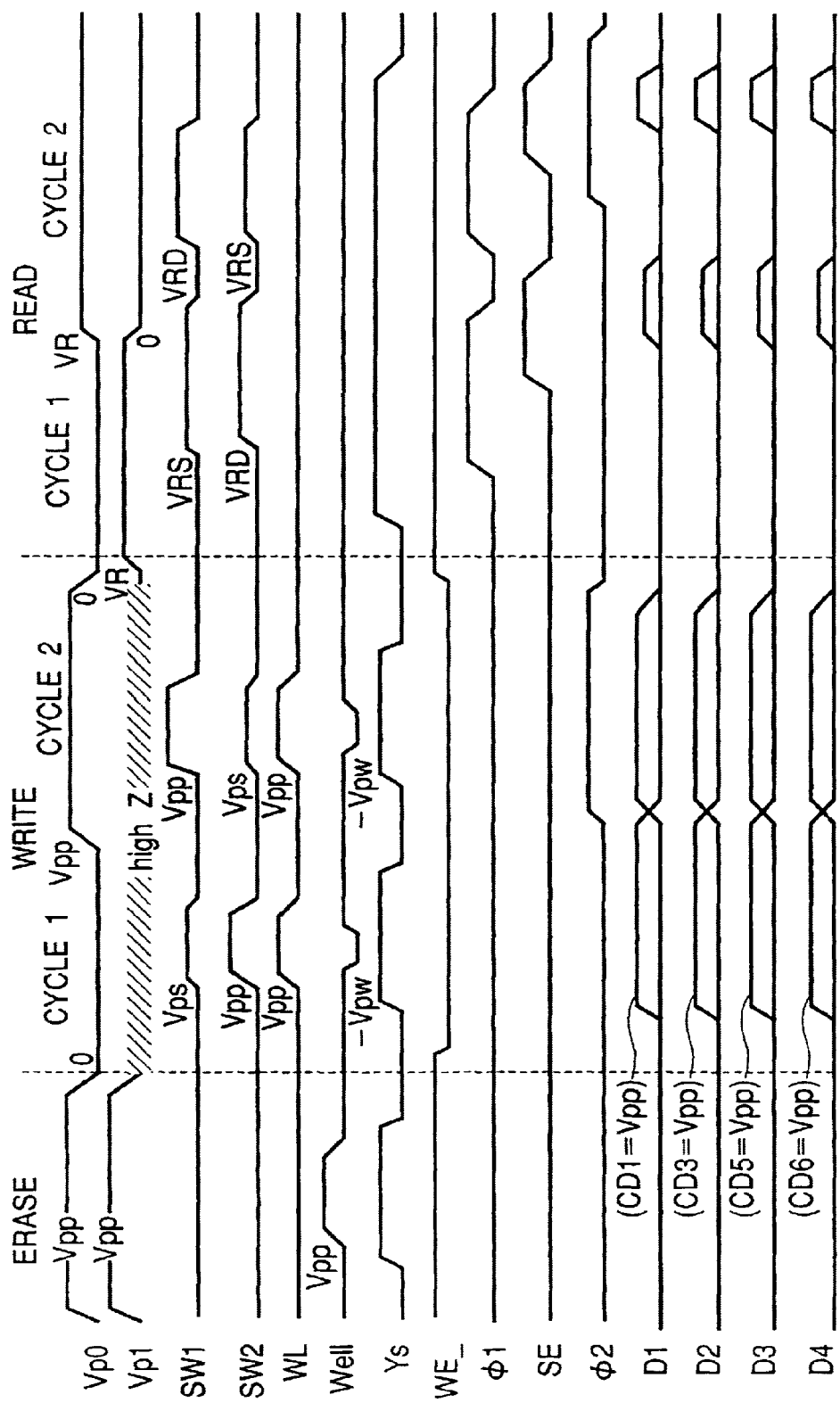
FIG. 13 is a timing chart for describing erase, write and read operations under the circuit configurations shown in FIGS. 11 and 12.

A timing chart for describing erase, write and read operations in the circuit configurations shown in FIGS. 11 and 12 is illustrated in FIG. 13. An objective to be written and read is set as byte data to be stored in four memory cells which shares the use of the word line 33i in the well region 30m.

In the erase operation, voltages Vp0, Vp1 and a well potential WL are respectively set to Vpp (6V).

Since the injection of hot electrons is carried out with the data lines 44h and 44i sides as the source sides in a write cycle 1, Vp0 is set to 0V, CD1, CD3, CD4 and CD6 are set to 6V (write execution) or 0V (write blocking) according to write data D1 through D4. Since the injection of hot electrons is carried out with the data line 43h, 45h, 43i and 45i sides as the source sides in a write cycle 2, Vp0 is set to 6V, and CD1, CD3, CD4 and CD6 are set to 6V (write blocking) or 0V (write execution) according to write data D1_ through D4_.

Since information stored in the source sides on the data line 44h and 44i sides are read in a read cycle 1, the data lines 43h, 44h, 45h, 43i, 44i and 45i are precharged with the voltage Vp0 and the voltage Vp1 as 0V and VR (1.8V). The switch states of the selectors S1, S2 and S3 at this time are represented as shown in FIG. 11. Thereafter, the selected state of the switch S1 is switched to the corresponding sense amplifier 50 side, and the switch control line 36i (SW1), and 37i (SW2) are changed to select levels VRS and VRD. Thus, the sense amplifier 50 detects whether a current flows from the drain of each memory cell to the source thereof (a charge is drawn or extracted from each of the data lines 43h, 45h, 43i and 45i). Since information stored in the source sides on the data lines 43h, 45h, 43i and 45i sides are read in a read cycle 2, the data lines 43h, 44h, 45h, 43i, 44i and 45i are precharged with the voltage Vp0 and the voltage Vp1 as VR (1.8V) and 0V in reverse this time. The selected states of the selectors S1, S2 and S3 at this time are represented as shown in FIG. 12. Thereafter, the selected state of the switch S1 is switched to the corresponding sense amplifier 50 side, and the switch control line 36i (SW1), and 37i (SW2) are changed to select levels VRS and VRD. Thus, the sense amplifier 50 detects whether a current flows from the drain of each memory cell to the source thereof (a charge is drawn or extracted from each of the data lines 44h and 44i).

According to the configurations shown in FIGS. 11 and 12, since one sense amplifier is shared between a data line pair respectively connected to both sides of each memory cell as in the case of 43h and 44h, the number of sense amplifiers can be reduced. Therefore, this contributes to a reduction in chip occupied area.

<<Another MONOS Memory Cell Structure>>

Figure 14:
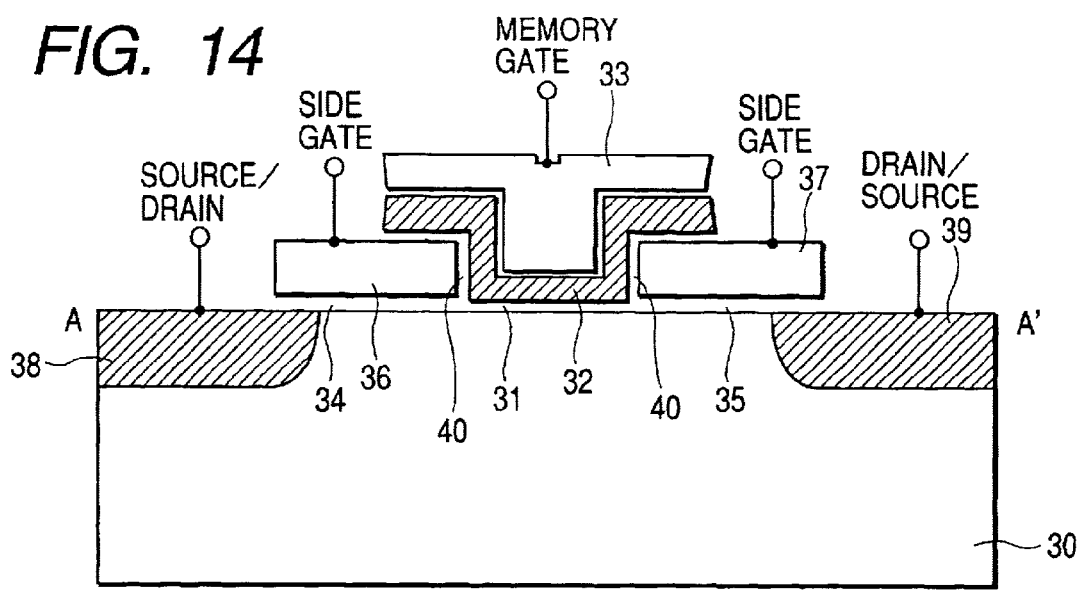
FIG. 14 is a cross-sectional view illustrating a structure of another nonvolatile memory cell of a multi-storage form according to a source side injection system.
Figure 15:
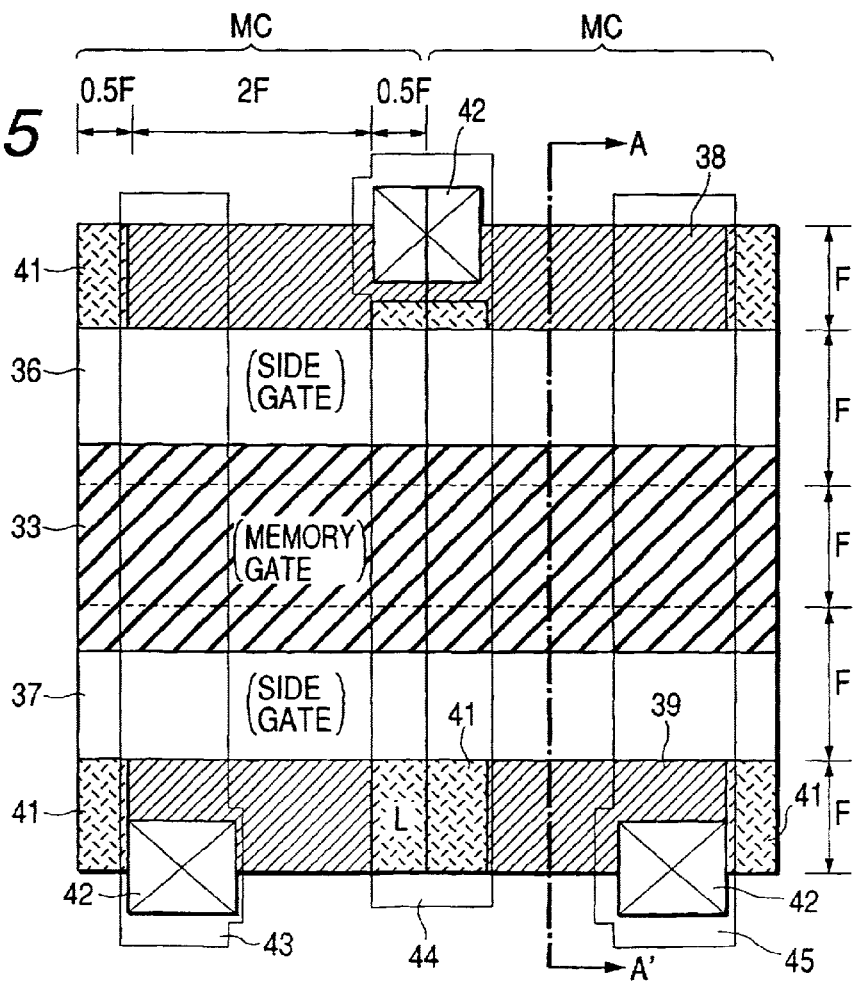
FIG. 15 is a configuration diagram of a plan layout in which two nonvolatile memory cells each having the sectional structure of FIG. 14 are configured as a minimum unit.

FIG. 14 illustrates a sectional structure of another nonvolatile memory cell of a multi-storage form according to a source side injection system. FIG. 15 shows a plan layout in which two nonvolatile memory cells each having the sectional structure of FIG. 14 are configured as a minimum unit. A basic structure of each memory cell shown in the same drawing is identical to FIG. 1 but different therefrom in that after the formation of a p-type well region 30, switch gates 36 and 37 are first formed of polysilicon corresponding to a first layer and thereafter a MONOS structure having a gate nitride film 32 is formed. Even if the interval between the switch gate electrodes 36 and 37 is set to a minimum processed size in the case of the structure shown in FIG. 15, no problem occurs in the formation of the gate nitride film 32 and memory gate electrode 33 thereon even if some mask shift occurs. In the structure shown in FIG. 1 as compared with it, the width of the memory gate electrode 33 must be set to greater than a minimum processed size F to bring the interval between the switch gate electrodes 36 and 37 on the memory gate electrode 33 to a minimum processed size. Further, since a shift in mask alignment influences the thickness of each interlayer insulating film 40, a mask alignment allowance is required. Since the allowance for mask alignment between the first and second layers formed of polysilicon is also unnecessary according to the device structure shown in FIG. 15 as a result of the above, it is possible to reduce a memory cell size as compared with the structure shown in FIG. 1. Further, asymmetricity of structures of both sides of each memory cell incident to the shift in mask alignment is avoided, and variations in operating characteristics of both bits in one memory cell can be reduced.

<<High-concentration Impurity Region Added First MONOS Memory Cell Structure>>

Figure 16:
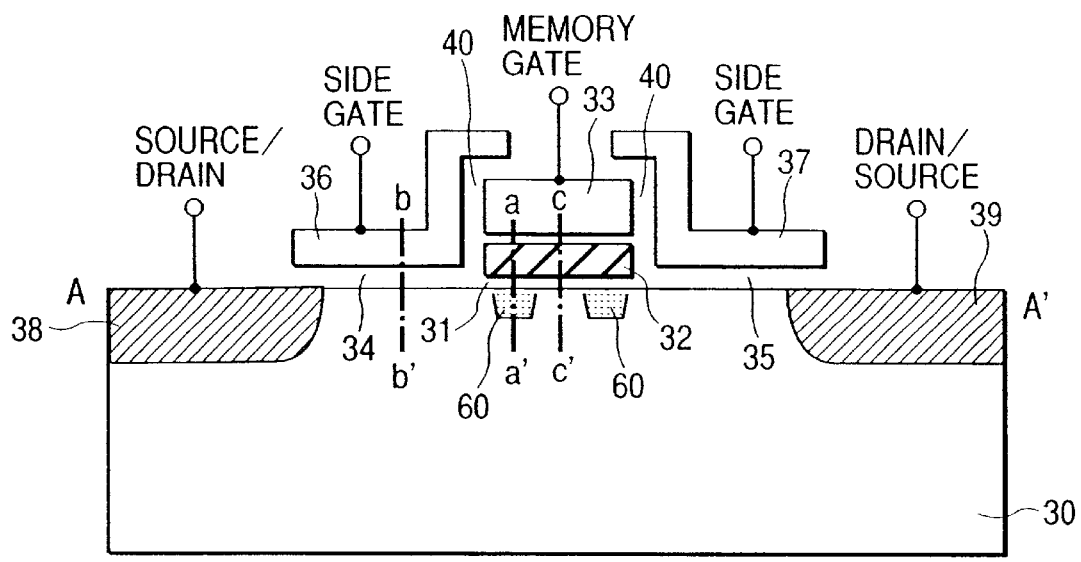
FIG. 16 is a cross-sectional view illustrating a memory cell structure having a high-concentration impurity region at a channel portion, as a further nonvolatile memory cell of a multi-storage form according to a source side injection system.
Figure 17:
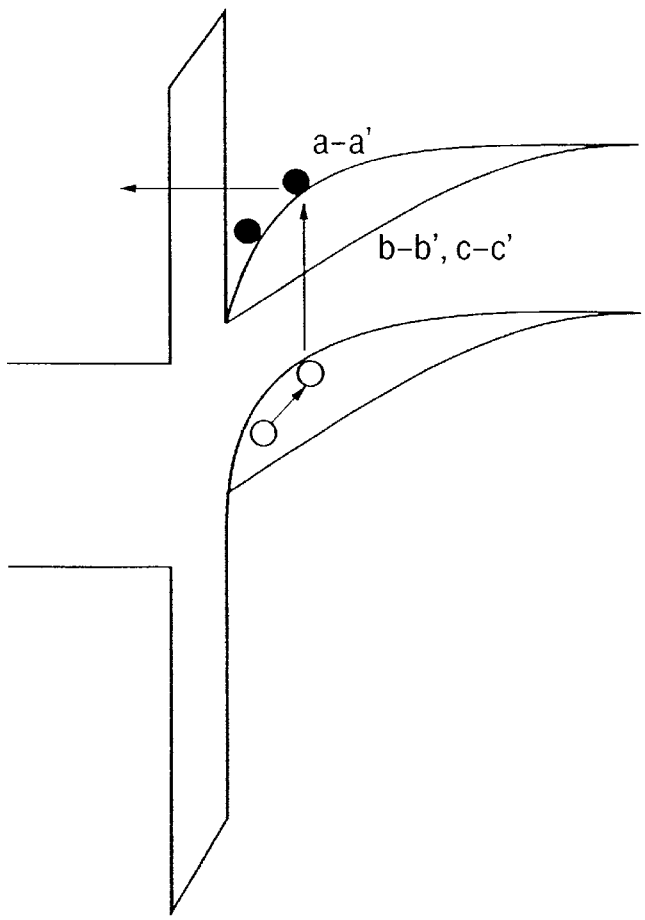
FIG. 17 is an energy band diagram showing sectional portions taken along line a–a', b–b' and c–c' of FIG. 16.

A sectional structure of a further nonvolatile memory cell of a multi-storage form according to a source side injection system is illustrated in FIG. 16. The nonvolatile memory cell shown in the same drawing is different from one shown in FIG. 1 in that in the memory cell structure shown in FIG. 1, p-type high-concentration impurity regions 60 are provided in the well region 30 placed just below both ends of the gate nitride film 32. If such high-concentration impurity regions 60 are formed, then a strong electric field is formed in the direction orthogonal to the boundary face between the gate insulating film and the gate nitride film at the high-concentration impurity regions 60 if a negative voltage (−Vpw) is applied to the well region 30 upon writing, i.e., a backward substrate bias voltage is applied to the well region 30. Namely, reference is made to an energy band diagram shown in FIG. 17. In this case, its change is made steep in an a–a' direction in which the high-concentration impurity regions 60 exist, as compared with a b–b' direction and a c–c' direction free of the high-concentration impurity regions 60. This means that the field strength in the vertical direction increases. Thus, holes are drawn into the well region 30 at directly below the high-concentration impurity regions 60. As a result, secondary electrons are produced and injected into the gate nitride film 32 together with the electrons supplied from the source of the memory cell. Thus, even if an electric field is low between a memory gate electrode 33 and a signal electrode 38 on the source side, hot electrons can be produced in a short time and injected into the gate nitride film 32. Thus, since a write current to be supplied to the memory cell can be reduced, low power consumption can be promoted and a write time can also be shortened. Besides, since the electric field between the memory gate electrode 33 and the signal electrode 38 on the source side can be made small, the probability that electrons will be injected from the source side to an insulating film 40 between a switch gate electrode 36 (37) and the gate nitride film 32, is lowered, and the resistance characteristics of rewriting of each memory cell are also improved. Since the high-concentration impurity regions 60 are simply locally provided in the well region 30 under the gate nitride film 32 in particular, a backward substrate bias voltage can be applied to the well region 30 without degradation of junction withstand for the source and drain.

<<Manufacture of First MONOS Memory Cell Structure>>

A method of manufacturing a semiconductor device having the memory cell illustrated in FIG. 16 will be described with reference to FIGS. 18 through 24.

Figure 18:
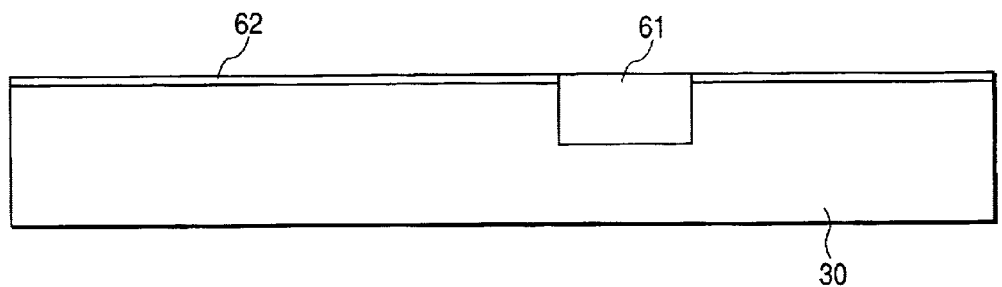
FIG. 18 is a vertical cross-sectional view illustrating one process of a method for manufacturing a semiconductor device having the memory cell illustrated in FIG. 16.

As illustrated in FIG. 18, a field oxide film 61 and an oxide film 62 are first formed on a monocrystal silicon substrate to constitute a p-type well region (first semiconductor region) 30.

Figure 19:
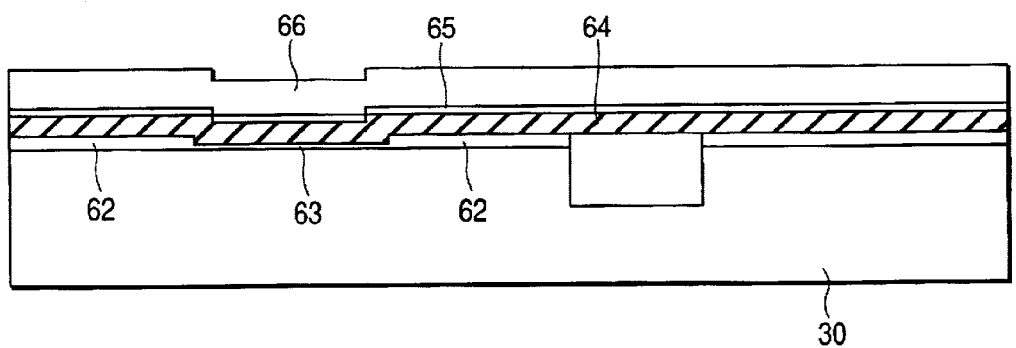
FIG. 19 is a vertical cross-sectional view illustrating a next process of the method for manufacturing the semiconductor device having the memory cell illustrated in FIG. 16.

Next, as shown in FIG. 19, the oxide film 62 in a memory forming region is opened and a tunnel oxide film (first insulating film) 63, a silicon nitride film (second insulating film) 64, an oxide film 65, and polysilicon 66 are deposited in order by thermal oxidation to form a MONOS structure.

Figure 20:
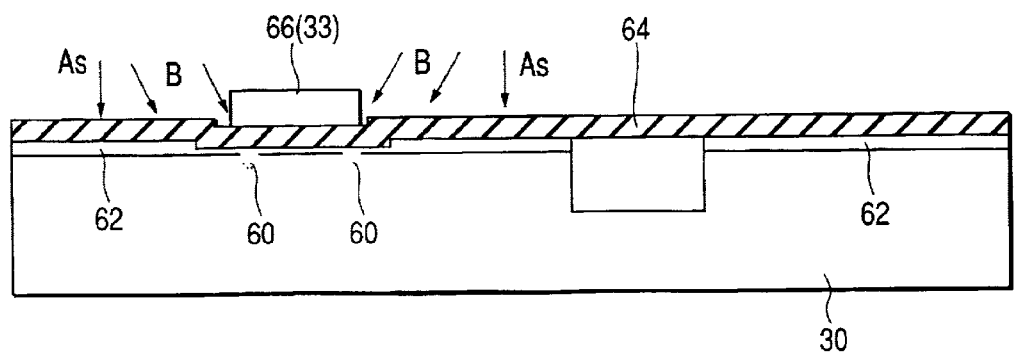
FIG. 20 is a vertical cross-sectional view illustrating a further next process of the method for manufacturing the semiconductor device having the memory cell illustrated in FIG. 16.

Next, as shown in FIG. 20, the polysilicon 66 is processed to form a memory gate electrode (first conductor element) 33. Thereafter, the memory gate electrode 33 is used as a mask and boron (B) is ion-implanted diagonally toward the inside of the memory gate electrode 33. Subsequently, arsenic (As) is injected therein. Thus, p-type high-concentration impurity regions (second semiconductor regions) 60 are formed in the well region directly below both ends of the memory gate electrode 33 constituting the MONOS structure. Since the boron (B) is diagonally ion-implanted and the arsenic (As) is continuously vertically injected as described above, a p-type impurity concentration of a portion where each of the p-type high-concentration impurity regions is overflowed outside the memory gate electrode 33 due to the ion-implantation of the boron, can be modified later owing to the injection of arsenic, whereby the high-concentration impurity region 60 can be fabricated with high accuracy.

Figure 21:
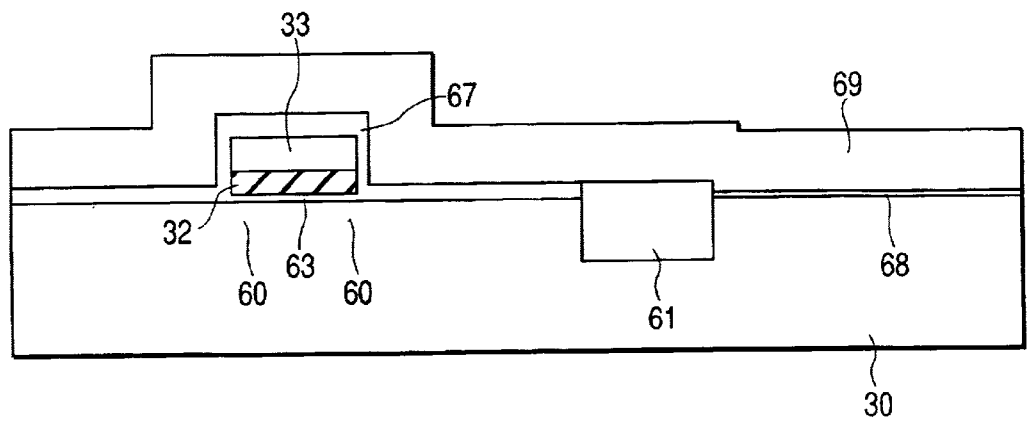
FIG. 21 is a vertical cross-sectional view illustrating a still further next process of the method for manufacturing the semiconductor device having the memory cell illustrated in FIG. 16.

Thereafter, as shown in FIG. 21, the nitride film 64 and the oxide film 65 are removed and a thermal oxide film (third insulating film) 67 (40) is formed. Afterwards, a thin gate thermal oxide film 68 is formed in a peripheral transistor region and polysilicon 69 is deposited on the whole from thereabove.

Figure 22:
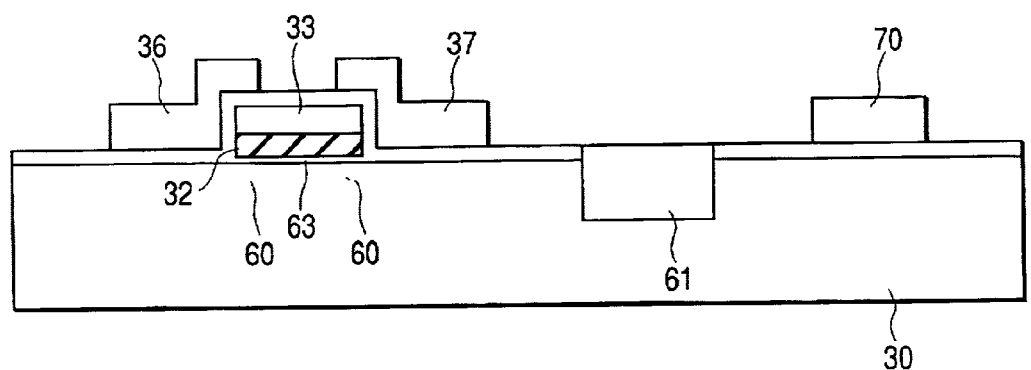
FIG. 22 is a vertical cross-sectional view illustrating a still further next process of the method for manufacturing the semiconductor device having the memory cell illustrated in FIG. 16.

As illustrated in FIG. 22, the polysilicon 69 is processed to form switch gate electrodes (second and third conductor elements or fragments) and a gate electrode 70 of a peripheral MOS transistor.

Figure 23:
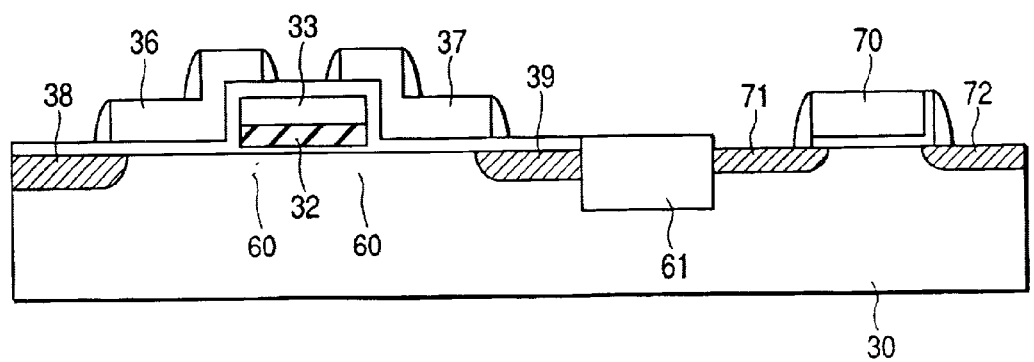
FIG. 23 is a vertical cross-sectional view illustrating a still further next process of the method for manufacturing the semiconductor device having the memory cell illustrated in FIG. 16.

As illustrated in FIG. 23, side-wall spacers are respectively formed on the switch gate electrodes 36 and 37 and the gate electrode 70. Thereafter, n-type impurity regions, e.g., n-type diffused regions used as source and drain electrodes are formed, whereby the signal electrodes 38 and 39 of a nonvolatile memory, and signal electrodes 71 and 72 of the peripheral MOS transistor are formed.

Figure 24:
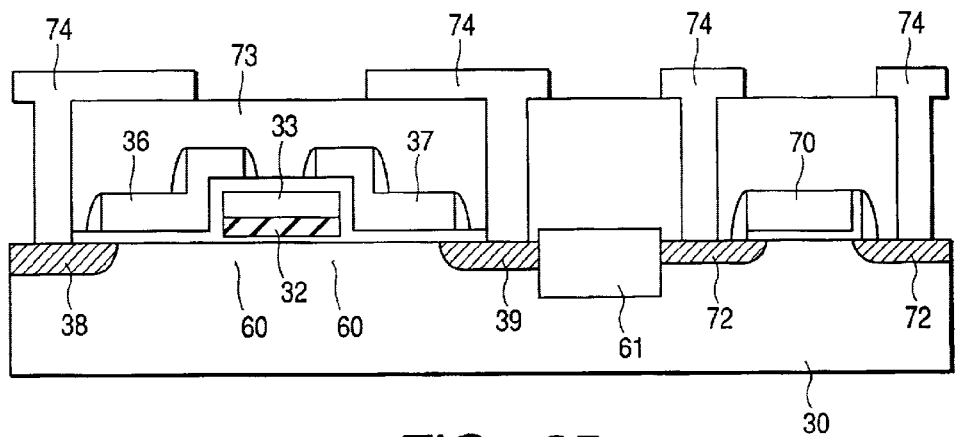
FIG. 24 is a vertical cross-sectional view illustrating a still further next process of the method for manufacturing the semiconductor device having the memory cell illustrated in FIG. 16.

Afterwards, as illustrated in FIG. 24, an interlayer insulating film 73 is deposited on the whole and the surface thereof is flattened. Thereafter, contact holes are defined in the interlayer insulating film 73 to form metal wirings 74.

<<High-concentration Impurity Region Added Type Second MONOS Memory Cell Structure>>

Figure 25:
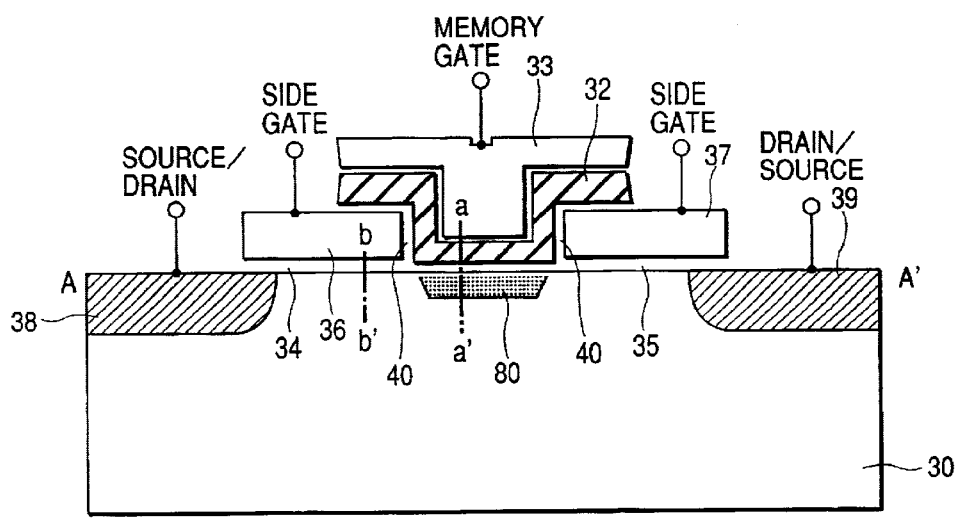
FIG. 25 is a cross-sectional view illustrating a memory cell structure having a high-concentration impurity region at a channel portion, as a still further nonvolatile memory cell of a multi-storage form according to a source side injection system.

A sectional structure of a still further nonvolatile memory cell of a multi-storage form according to a source side injection system is illustrated in FIG. 25. The nonvolatile memory cell shown in the same drawing is different from one shown in FIG. 14 in that in the memory cell structure shown in FIG. 14, a p-type high-concentration impurity region 80 is provided in the well region 30 placed just below both ends of the gate nitride film 32. If such high-concentration impurity region 80 is formed, then a strong electric field is formed in the direction orthogonal to the boundary face between a gate insulating film and a gate nitride film at the high-concentration impurity region 80 if a backward substrate bias voltage is applied to the well region 30 upon writing in a manner similar to FIG. 16. Thus, even if an electric field is low between a memory gate electrode 33 and a signal electrode 38 on the source side, hot electrons can be produced in a short period of time and injected into the gate nitride film 32. Thus, since a write current to be supplied to the memory cell can be reduced, low power consumption can be promoted and a write time can also be shortened. Besides, since the electric field between the memory gate electrode 33 and the signal electrode 38 on the source side can be made small, the probability that electrons will be injected from the source side to a region between the switch gate electrode 36 (37) and the memory gate electrode 33, is lowered, and the resistance to rewriting of each memory cell is also improved. Since the high-concentration impurity region 80 are simply locally provided in the well region 30 under the gate nitride film 32 in particular, a backward substrate bias voltage can be applied to the well region 30 without degradation of junction withstand for the source and drain.

<<Manufacture of Second MONOS Memory Cell Structure>>

A method of manufacturing a semiconductor device having the memory cell illustrated in FIG. 25 will be described with reference to FIGS. 26 through 32.

Figure 26:
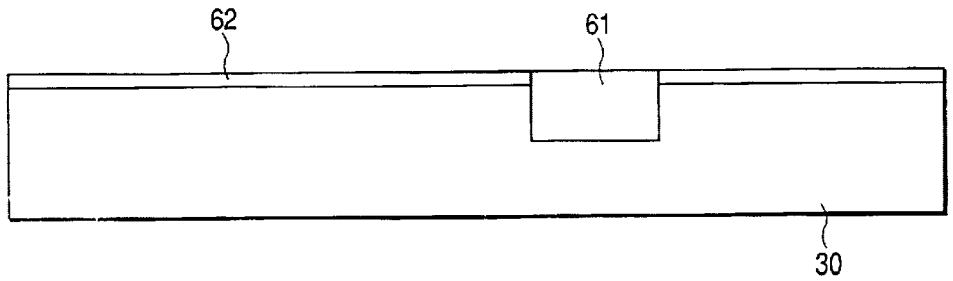
FIG. 26 is a vertical cross-sectional view illustrating one process of a method for manufacturing a semiconductor device having the memory cell illustrated in FIG. 25.

As illustrated in FIG. 26, a field oxide film 61 and an oxide film 62 are first formed on a monocrystal silicon substrate to constitute a p-type well region (first semiconductor region) 30.

Figure 27:
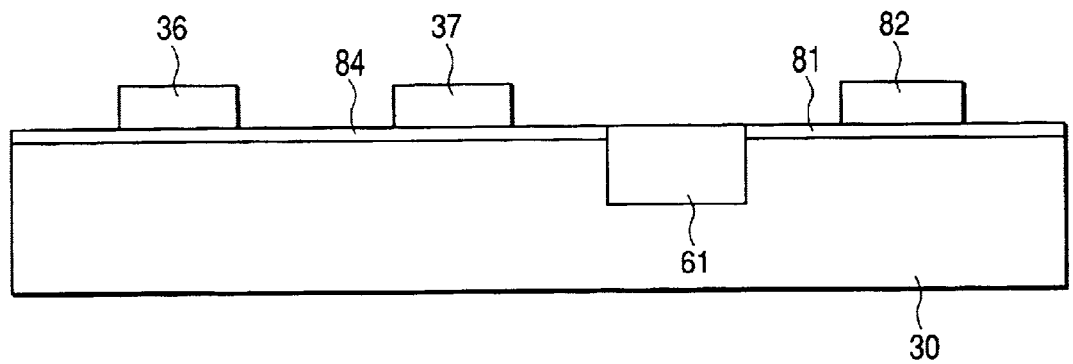
FIG. 27 is a vertical cross-sectional view illustrating a next process of the method for manufacturing the semiconductor device having the memory cell illustrated in FIG. 25.

The oxide film 62 is removed, and a switch gate insulating film 84 and a peripheral MOS transistor gate oxide film 81 are formed as shown in FIG. 27. Thereafter, polysilicon is deposited and processed to form switch gate electrodes (first conductor elements or pieces) 36 and 37 and a gate electrode 82 of a peripheral MOS transistor.

Figure 28:
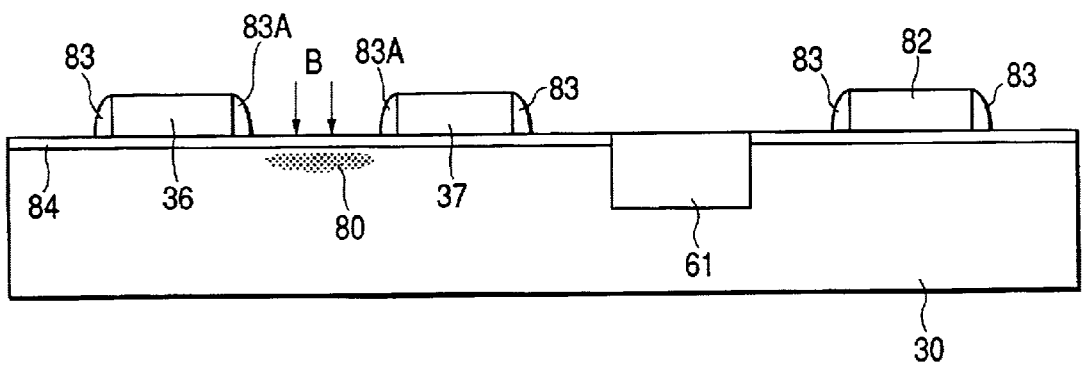
FIG. 28 is a vertical cross-sectional view illustrating a further next process of the method for manufacturing the semiconductor device having the memory cell illustrated in FIG. 25.

Next, as illustrated in FIG. 28, side-wall spacers 83 and 83A are formed on their corresponding gate electrodes 36, 37 and 82. Thereafter, boron (B) is vertically ion-implanted in a region interposed between the side-wall spacers 83A (first insulating film) to form a p-type high-concentration impurity region 80 between the switch gate electrodes 36 and 37. In order to form the side-wall spacers 83 and 83A, an insulating film is deposited on the whole surface and subjected to anisotropic etching and the spacers may selectively be left on the side walls of the gate electrodes 36, 37 and 82.

Figure 29:
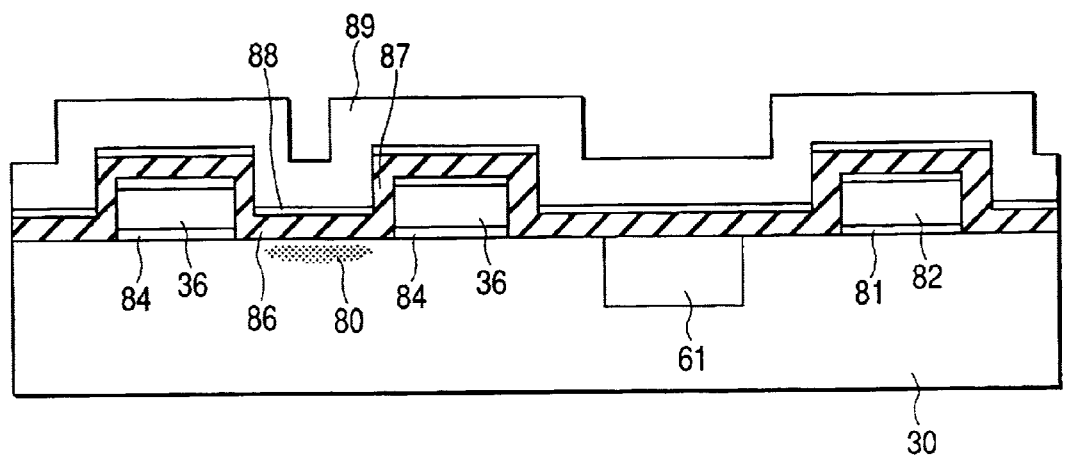
FIG. 29 is a vertical cross-sectional view illustrating a still further next process of the method for manufacturing the semiconductor device having the memory cell illustrated in FIG. 25.

After the side-wall spacers 83 and 83A are removed as shown in FIG. 29, a tunnel oxide film 88, a silicon nitride film 87 and an oxide film 88 are formed, and a polysilicon film 89 is entirely deposited from thereabove.

Figure 30:
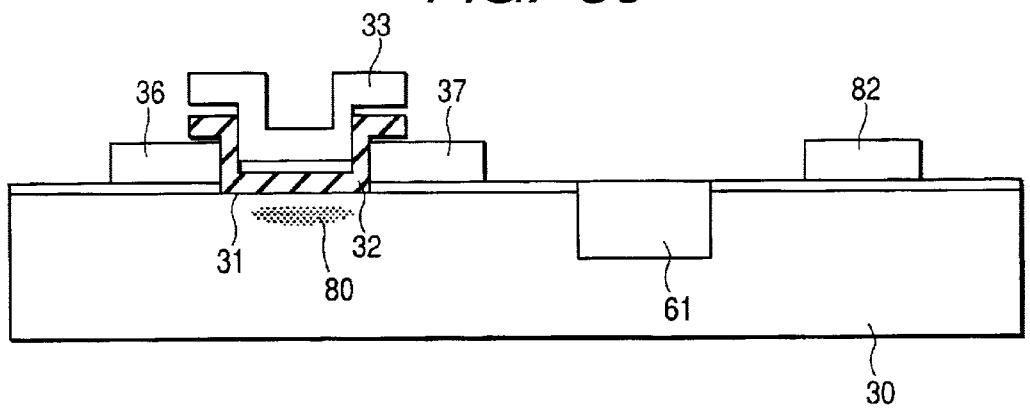
FIG. 30 is a vertical cross-sectional view illustrating a still further next process of the method for manufacturing the semiconductor device having the memory cell illustrated in FIG. 25.

Next, as shown in FIG. 30, the polysilicon film 89 is processed and the oxide film 88 and silicon nitride film 87 are partly removed with the remaining polysilicon films 89 as masks, so that a silicon nitride film 32 and a memory gate electrode (second conductor element) 33 are formed of the remaining portions. The silicon nitride film 32 and the memory gate electrode 33 are superimposed on the switch gate electrodes 36 and 37 and no problem occurs unless they do not protrude outside. In short, the interval sizes of the switch gate electrodes 36 and 37 formed of the polysilicon film corresponding to a first layer need high processing accuracy but mask alignment for the polysilicon film corresponding to a second layer with respect to the polysilicon film corresponding to the first layer need no high accuracy.

Figure 31:
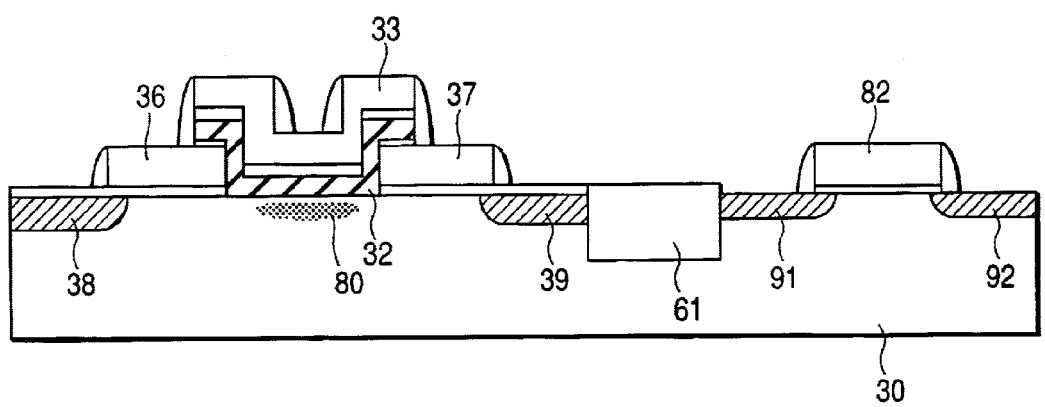
FIG. 31 is a vertical cross-sectional view illustrating a still further next process of the method for manufacturing the semiconductor device having the memory cell illustrated in FIG. 25.

Thereafter, as shown in FIG. 31, side-wall spacers are formed and thereafter n-type impurity regions, e.g., n-type diffused regions used as source and drain electrodes are formed, so that the signal electrodes 38 and 39 of a nonvolatile memory, and signal electrodes 91 and 92 of the peripheral MOS transistor are formed.

Figure 32:
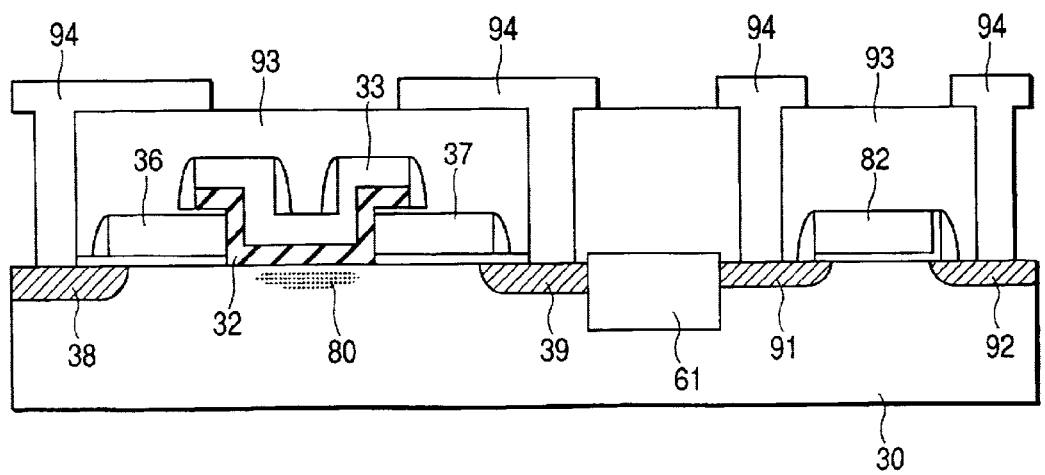
FIG. 32 is a vertical cross-sectional view illustrating a still further next process of the method for manufacturing the semiconductor device having the memory cell illustrated in FIG. 25.

Further, as illustrated in FIG. 32, an interlayer insulating film 93 is deposited on the whole and the surface thereof is flattened. Thereafter, contact holes are defined in the interlayer insulating film 73 to form metal wirings 94.

<<Another Example of Erasure>>

Figure 33:
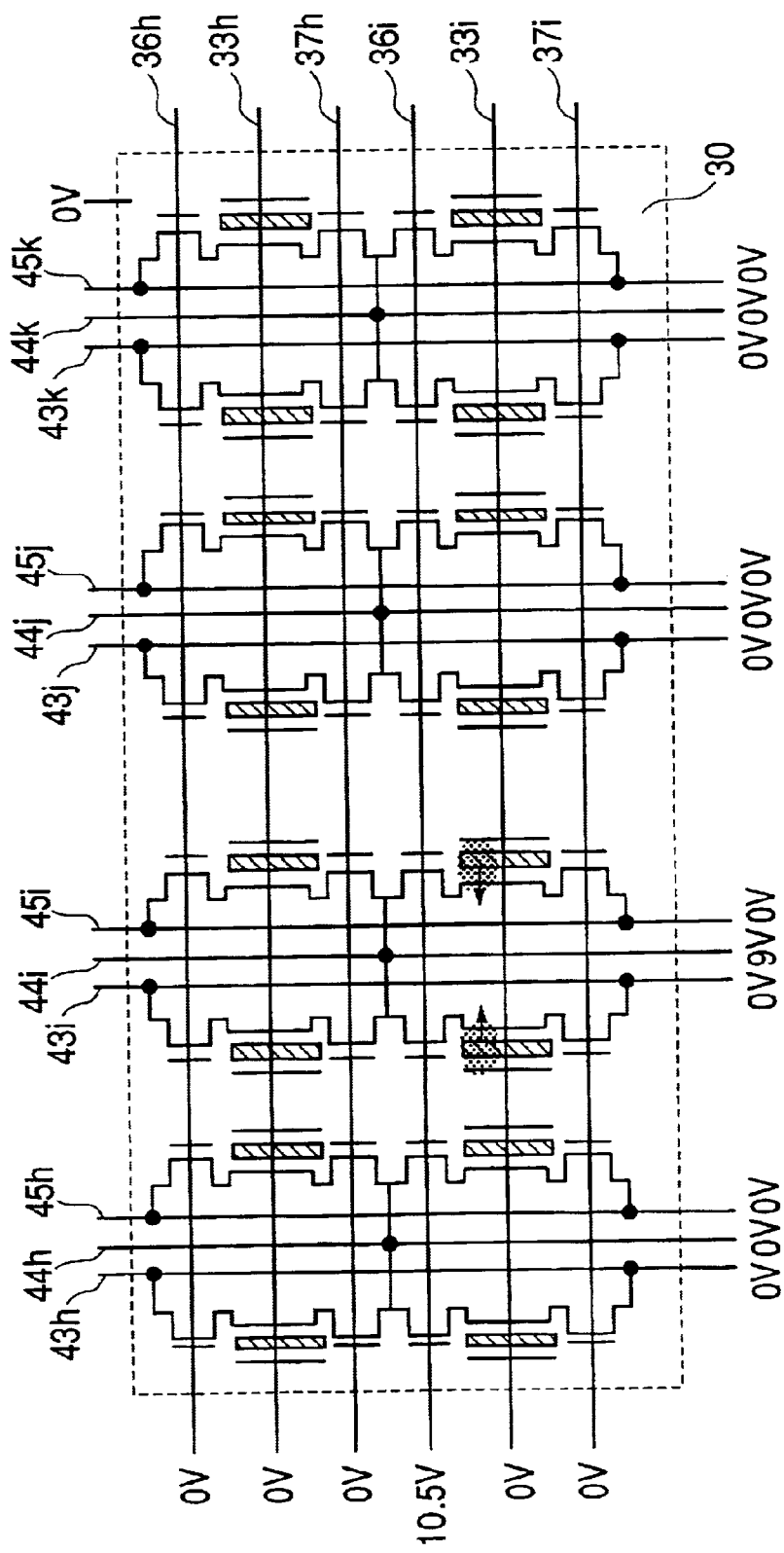
FIG. 33 is a circuit diagram showing another example of the erasure.

FIG. 33 shows another example of the erasure. In the example shown in the same drawing, while the potential of a well region is being maintained at 0V, Vpp' is applied to a side gate corresponding to bits on the erasure side, and Vpp is applied to each data line to thereby perform erasing. An erasure represented in 2-bit units at minimum is allowed without finely separating the well region. This can contribute to a reduction in chip occupied area.

Figure 34:
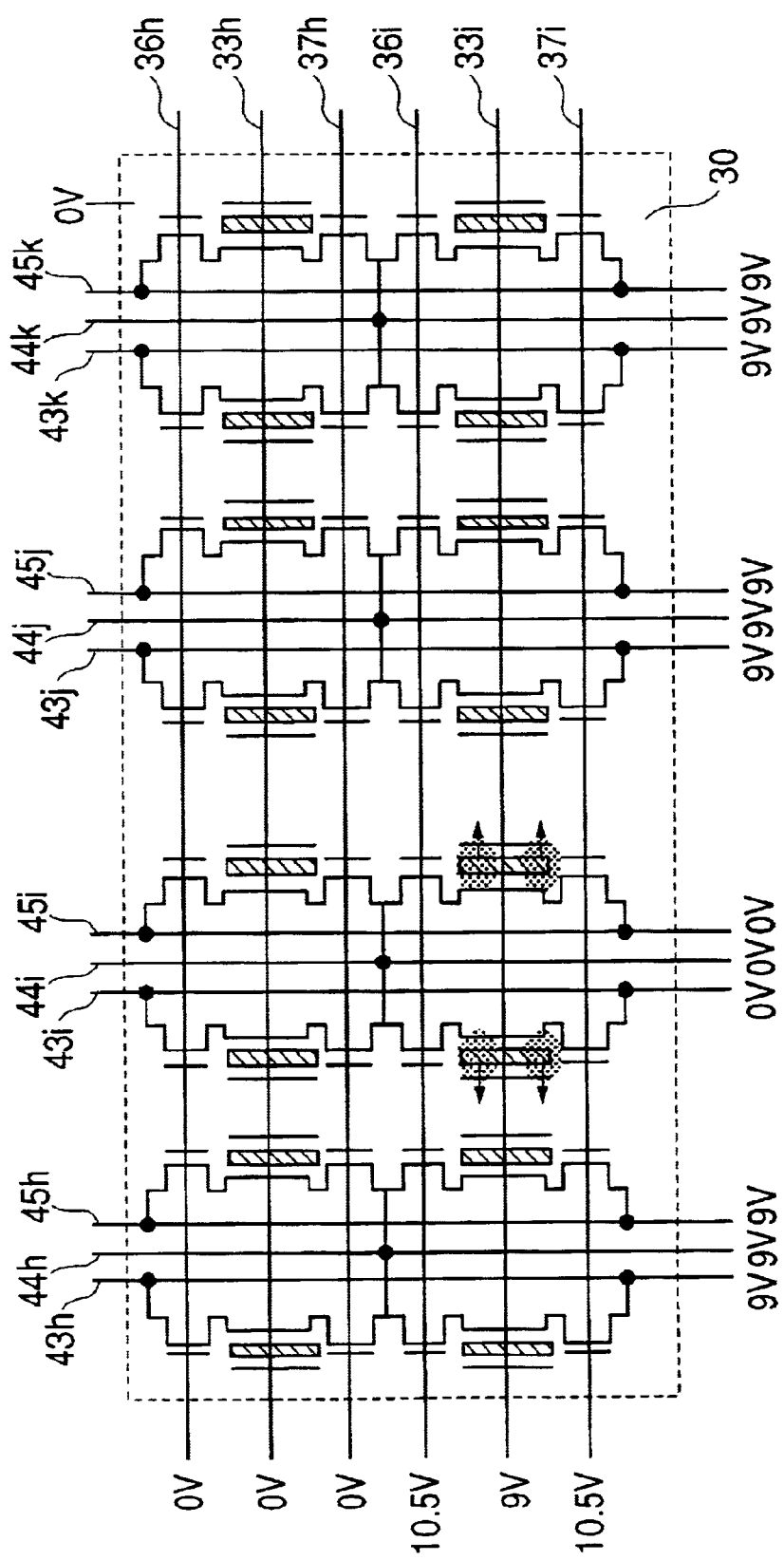
FIG. 34 is a circuit diagram illustrating a further example of the erasure.

FIG. 34 shows a further example of the erasure. Forming a tunnel oxide film so as to take 3 nm or more in thickness suppresses tunnel injection from a silicon substrate, and electrons are drawn into a polysilicon gate to perform erasing. Namely, while the well region is being maintained at 0V, Vpp is applied to its corresponding word line of each memory cell for erasure, and Vpp' is applied to it corresponding side gate. Vpp is applied to its corresponding data line of each cell for non-erasure during erase selection to suppress erasing. It is possible to perform an erasure in 4-bit units without well separation. This contributes to a reduction in chip occupied area. The erasure system shown in FIG. 34 provides less erase disturb as compared with the case shown in FIG. 33.

Figure 35:
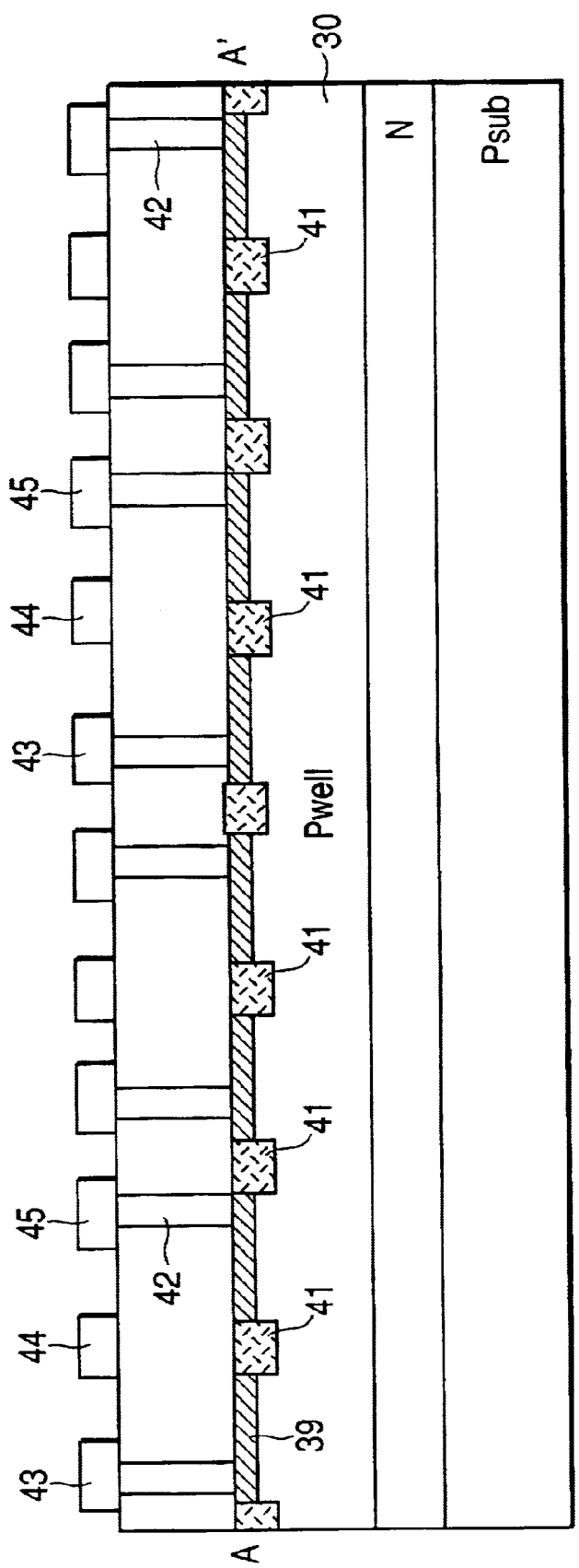
FIG. 35 is a cross-sectional view of a longitudinally-cut structure of one signal electrode employed in a memory cell array where the erasures shown in FIGS. 33 and 34 are carried out.
Figure 36:
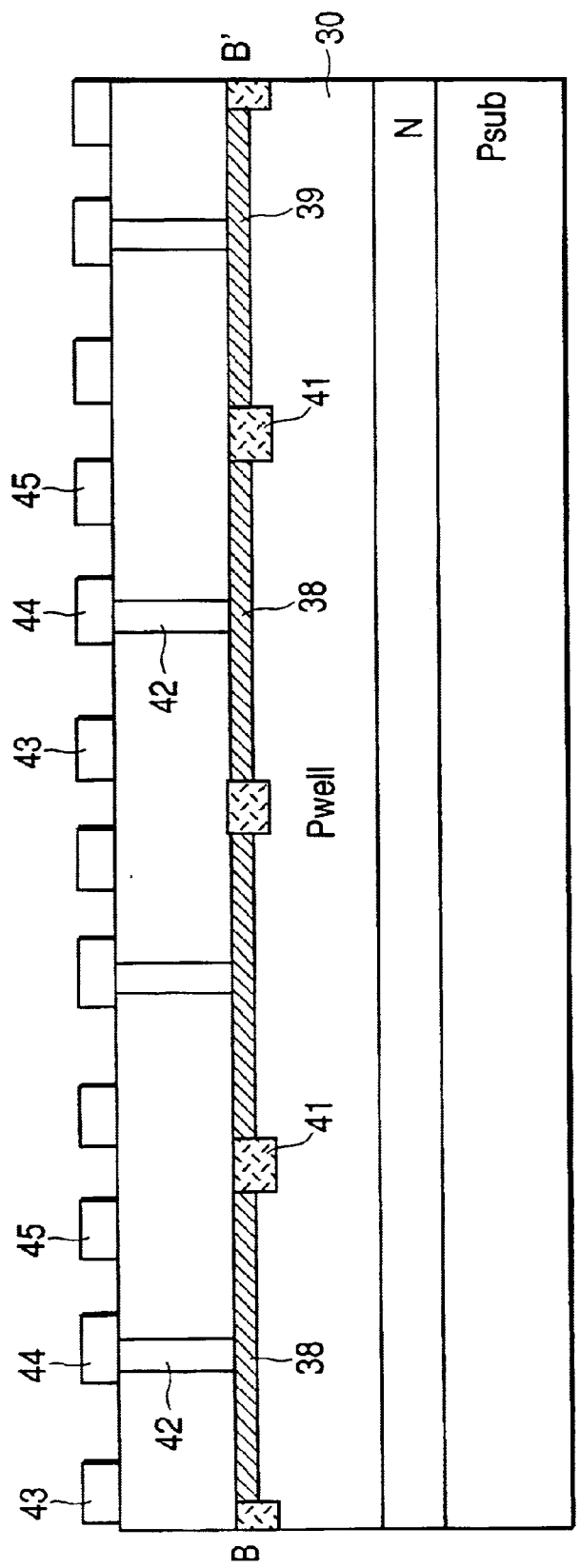
FIG. 36 is a cross-sectional view of a longitudinally-cut structure of the other signal electrode employed in the memory cell array where the erasures shown in FIGS. 33 and 34 are executed.

Since it is not necessary to separate a well region in 8-bit units as illustrated in FIGS. 35 and 36 when the erasures shown in FIGS. 33 and 34 are performed, the n-type well region 48 such as shown in FIGS. 4 and 5 is unnecessary.

<<Another Example of Plan Layout>>

Figure 37:
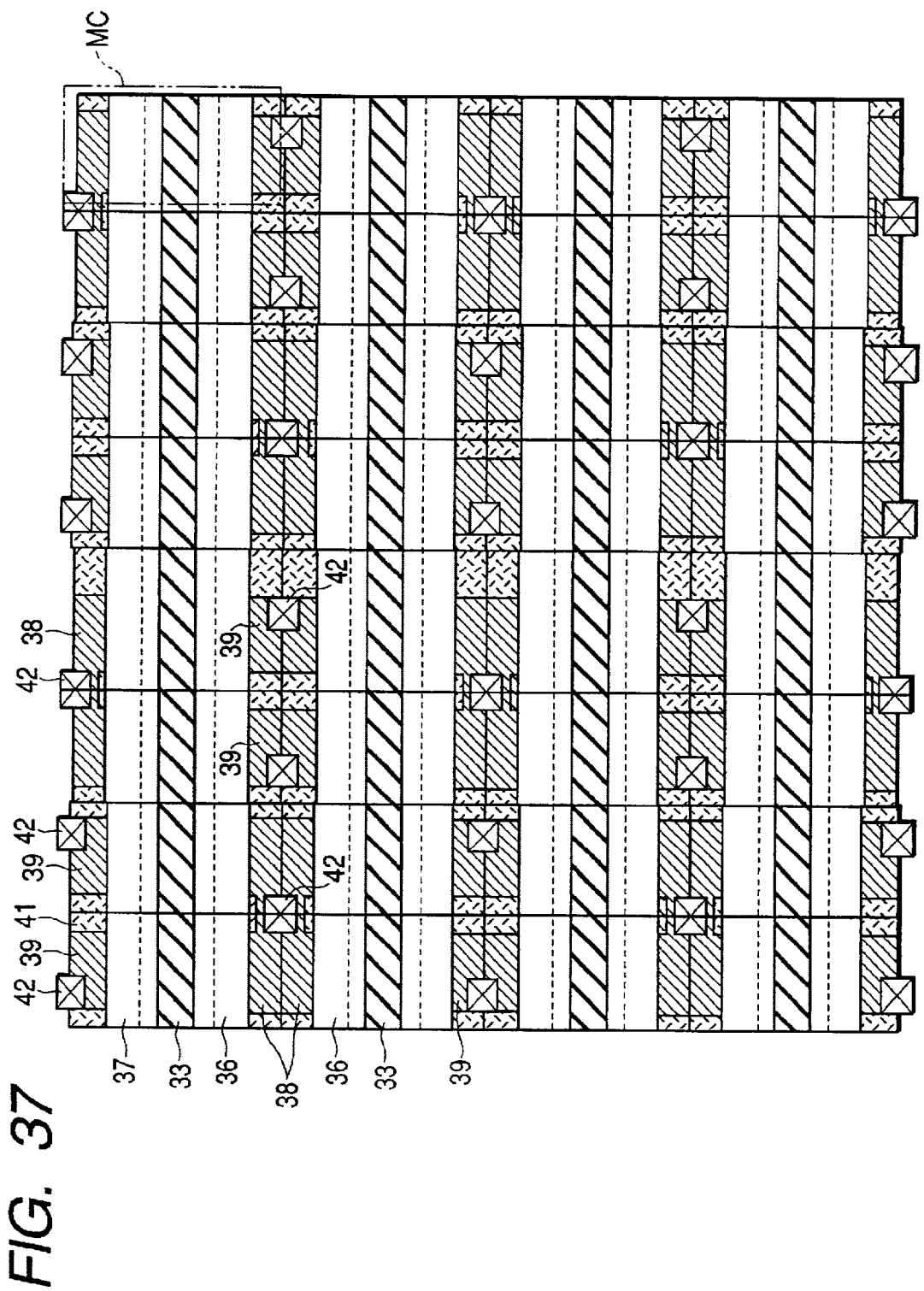
FIG. 37 is a plan view showing another example of the plan layout with respect to the minimum unit shown in FIG. 2.

FIG. 37 shows another example of the plan layout with respect to the minimum unit shown in FIG. 2. In the layout shown in the same drawing, the unit patterns each shown in FIG. 2 are arranged in parallel so that the unit patterns adjacent to one another are placed upside down as viewed in vertical and horizontal directions of the drawing. In short, signal electrodes 36 and 37 lying in the horizontal direction extend so as to connect to one another on an alternate basis. Owing to such a layout configuration, contact holes 42 are uniformly distributed as compared with FIG. 3. It is thus possible to increase processing allowance for each contact hole 42.

Figure 38:
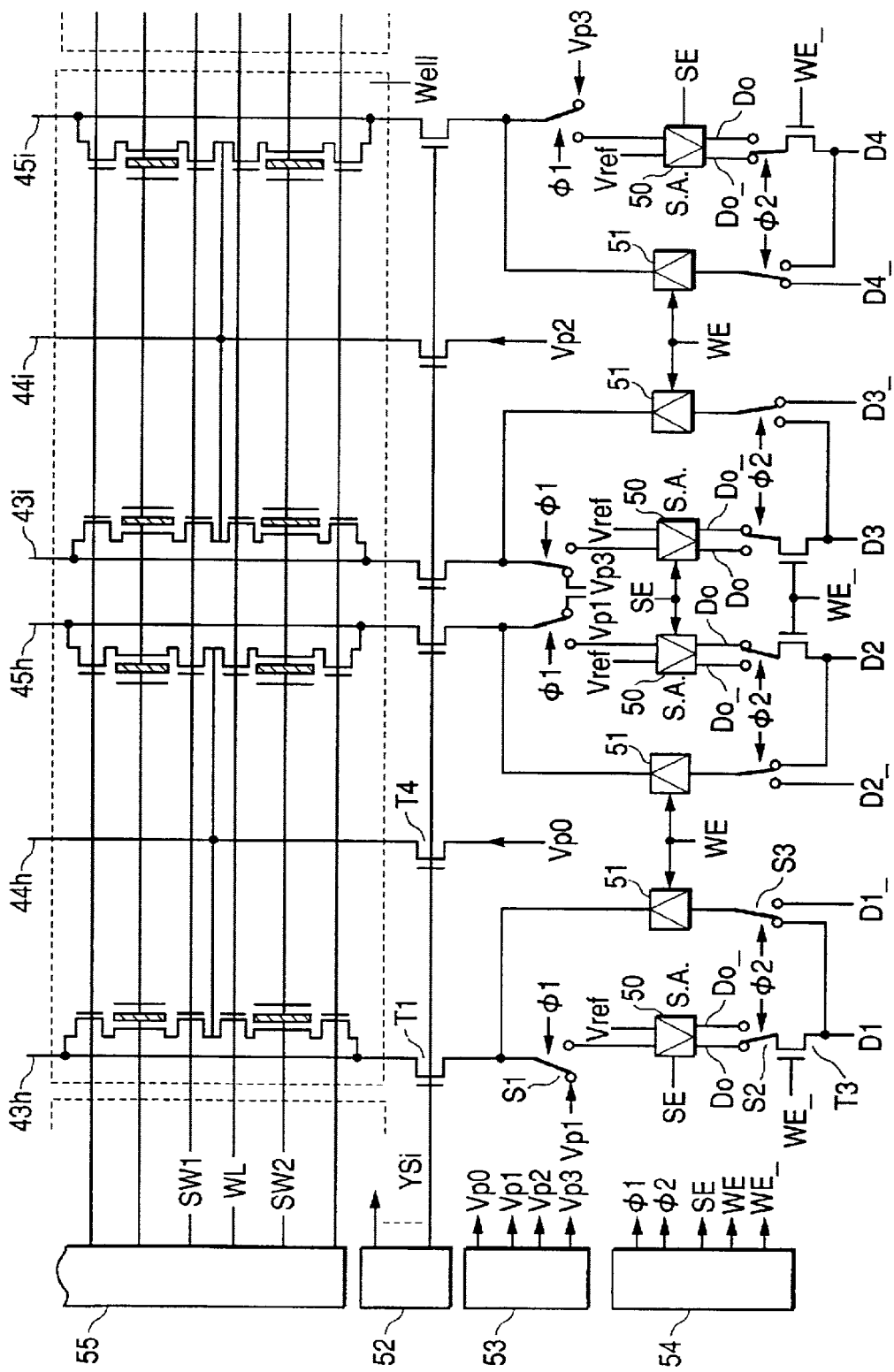
FIG. 38 is a circuit diagram illustrating a read minimum unit circuit corresponding to the plan layout shown in FIG. 37.

FIG. 38 illustrates a read minimum unit circuit corresponding to the plan layout shown in FIG. 37. Since the configuration of FIG. 37 has a relationship in which signal electrodes 36 and 37 adjacent to one another lying in a horizontal direction extend so as to connect on an alternate basis, with respect to FIG. 3, the circuit configuration of FIG. 38 is different from that of FIG. 11 in that the sources and drains for the right and left data lines are different in allocation. Namely, when a data line 44h is connected to its corresponding sources of memory cells and data lines 43h and 45h are connected to their corresponding drains of the memory cells, an adjacent data line 44i is connected to its corresponding drains of memory cells, and data lines 43i and 45i are connected to their corresponding sources of the memory cells. To this end, a precharge circuit 53 produces voltages Vp0, Vp1, Vp2 and Vp3 and makes it possible to apply the voltage Vp0 to the data line 44h, apply the voltage Vp1 to the data lines 43h and 45h, apply the voltage Vp2 to the data line 44i, and apply the voltage Vp3 to the data lines 43i and 45i.

Figure 39:
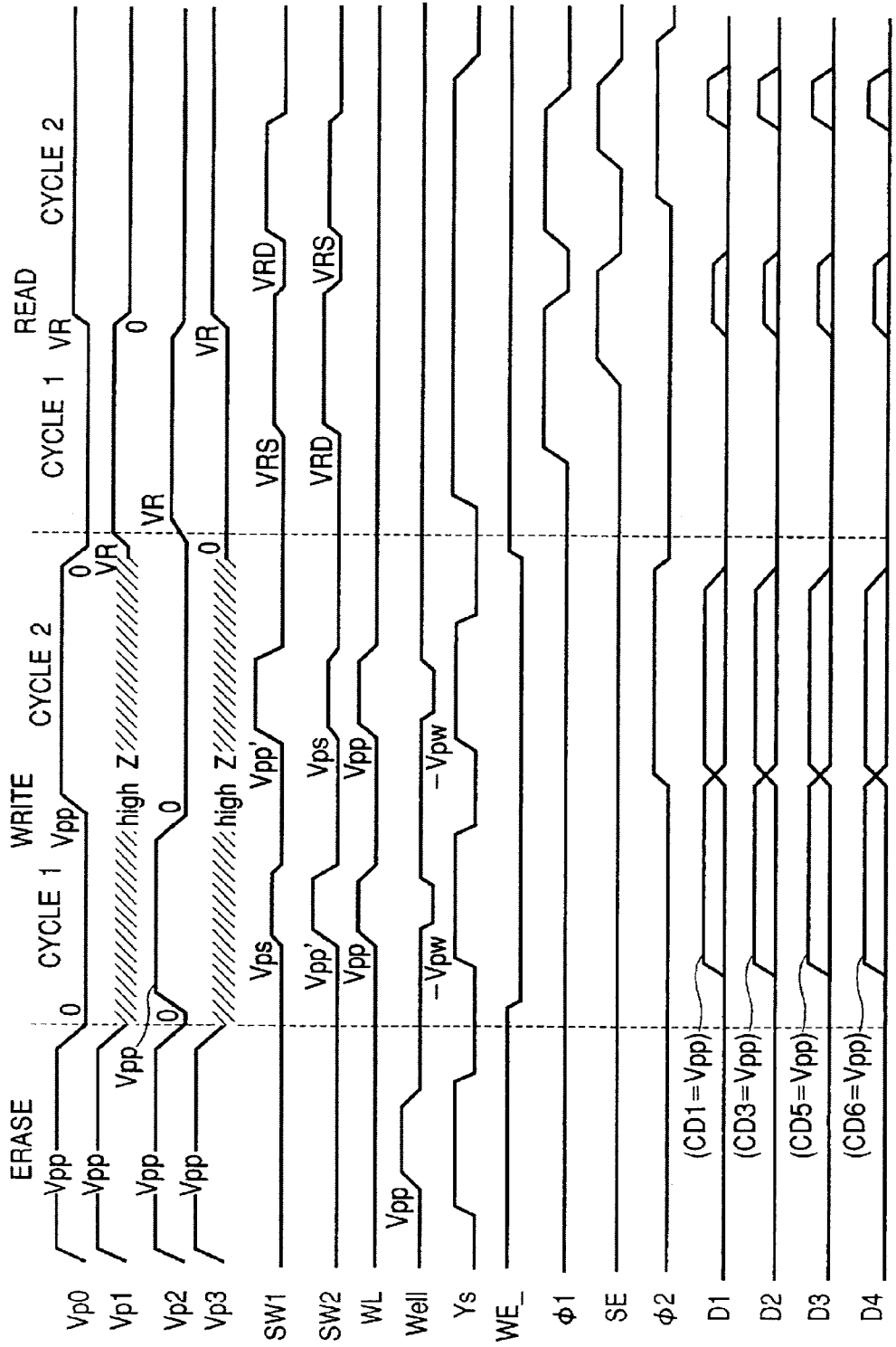
FIG. 39 is a timing chart illustrating erase, write and read operations employed in a circuit configuration shown in FIG. 38.

FIG. 39 illustrates erase, write and read operating timings in the circuit configuration shown in FIG. 38. Since the connection assignment of the data lines to the sources/drains of the memory cells can be switched as described above, the voltage Vp0 and the voltage Vp2 change in opposite phase in a cycle 1 and a cycle 2 upon the write operation. Similarly, the voltages Vp0, Vp1 and Vp2, Vp3 respectively change in opposite phase upon the read operation.

<<Application to IC Card>>

Figure 40:
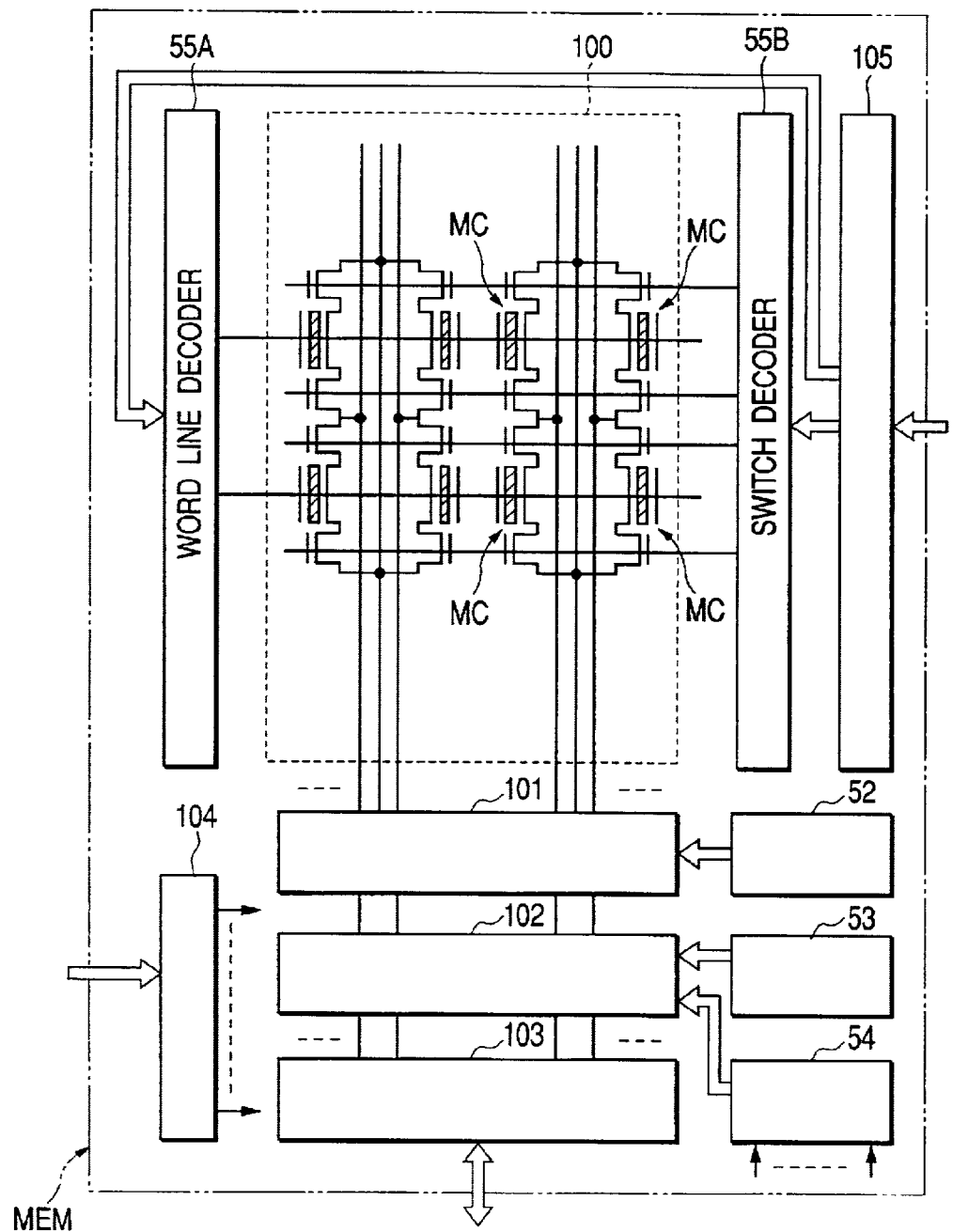
FIG. 40 is a schematic block diagram of a nonvolatile memory to which each nonvolatile memory cell of the multi-storage form is applied.

A nonvolatile memory MEM to which the nonvolatile memory cells MC are applied, is illustrated in FIG. 40. The nonvolatile memory MEM shown in the same drawing, corresponds to the circuit configuration shown in FIG. 1 although not restricted in particular. Designated at numeral 100 in FIG. 40 is a memory cell array in which the memory cells MC are arranged in matrix form. Word lines of the memory cells are selectively driven by a word line decoder 55A, and switch gate control lines are selectively driven by a switch decoder 55B. The respective decoders 55A and 55B correspond to the circuit shown in FIG. 11 and respectively decode address signals supplied to an address buffer 105 from outside, thereby selecting the corresponding word line and switch gate control line according to the result of decoding. A circuit block designated at numeral 101 is a column selection circuit which comprises an array of the switches T1 and T4. A circuit block designated at numeral 102 is an array of the switches S1, S2 and S3, sense amplifier 50 and write amplifier 51. A circuit block designated at numeral 103 is a data input/output buffer and is capable of being connected to the sense amplifier 50 and the write amplifier 51. A mode control circuit 104 performs the entire timing control and power control of the nonvolatile memory MEM except for the function executed by the timing control circuit 54. The timing control circuit 54 and the mode control circuit 104 constitute a control circuit for the nonvolatile memory MEM.

Figure 41:
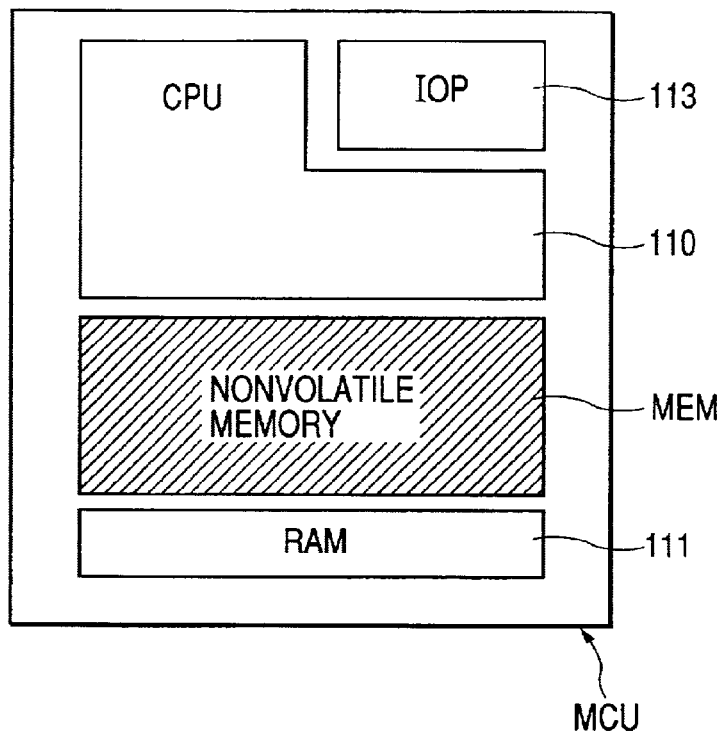
FIG. 41 is a schematic block diagram showing one example of a microcomputer in which the nonvolatile memory typified in FIG. 40 is built.

A microcomputer in which such a nonvolatile memory MEM as typified in FIG. 40 is built, is shown in FIG. 41. The microcomputer shown in the same drawing has a CPU 110, an external interface circuit (IOP) 113, a RAM 111, and the nonvolatile memory MEM. The CPU fetches and decodes an instruction and performs arithmetic processing according to the result of decoding. When a microcomputer for an IC card is assumed, for example, it has sum-of-products operational logic or the like for security control. The RAM 111 is used as a work area or data temporary storage area for the CPU 110. The nonvolatile memory MEM stores a program for operating the CPU and is used as an area for storing data information. The CPU 110 performs control on access to the nonvolatile memory MEM. The external interface circuit 113 is used for the input of commands and the input/output of data.

Allowing all of built-in nonvolatile memories to be electrically rewritten as in the nonvolatile memory MEM make it possible to rewrite stored information as compared with the use of part of the nonvolatile memories as a mask ROM. Therefore, this can contribute to a significant reduction in TAT (Turn Around Time) or design period.

Figure 42:
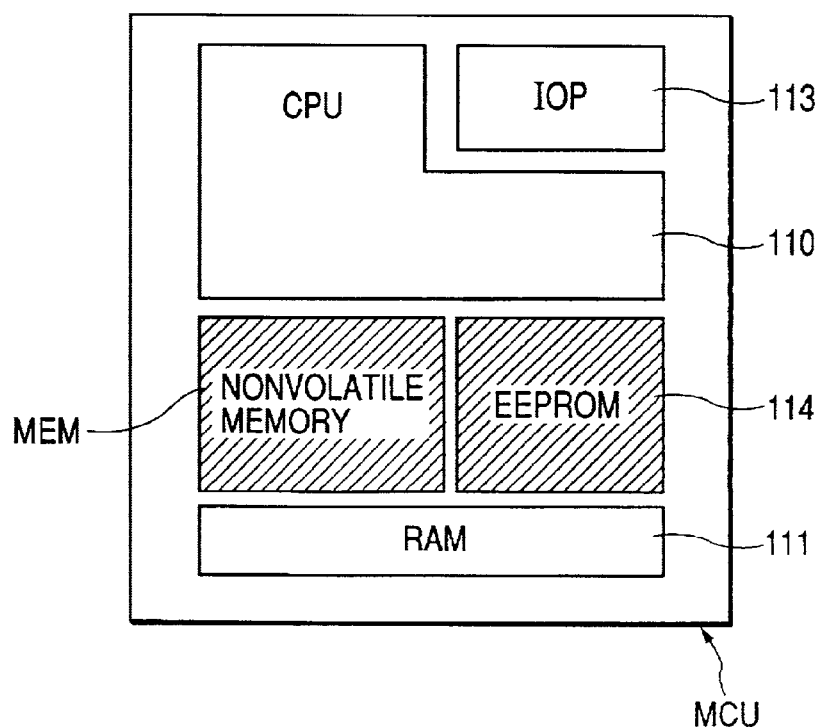
FIG. 42 is a schematic block diagram showing another example of the microcomputer having incorporated the nonvolatile memory typified in FIG. 40 therein.
Figure 47A:
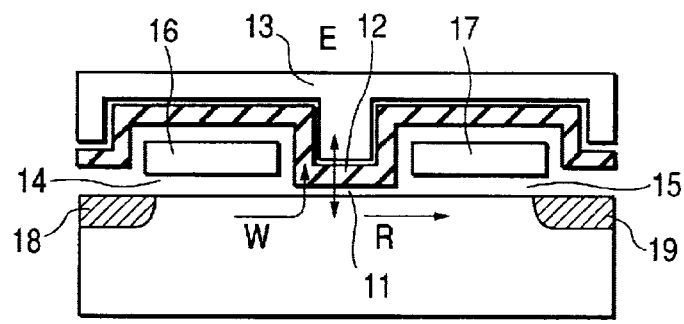
FIGS. 47(A) and 47(B) are explanatory views schematically showing a structure of a multi-storage type nonvolatile memory cell of a source side injection form, which has been discussed by the present inventors according to the preceding application done by the present applicant.
Figure 47B:
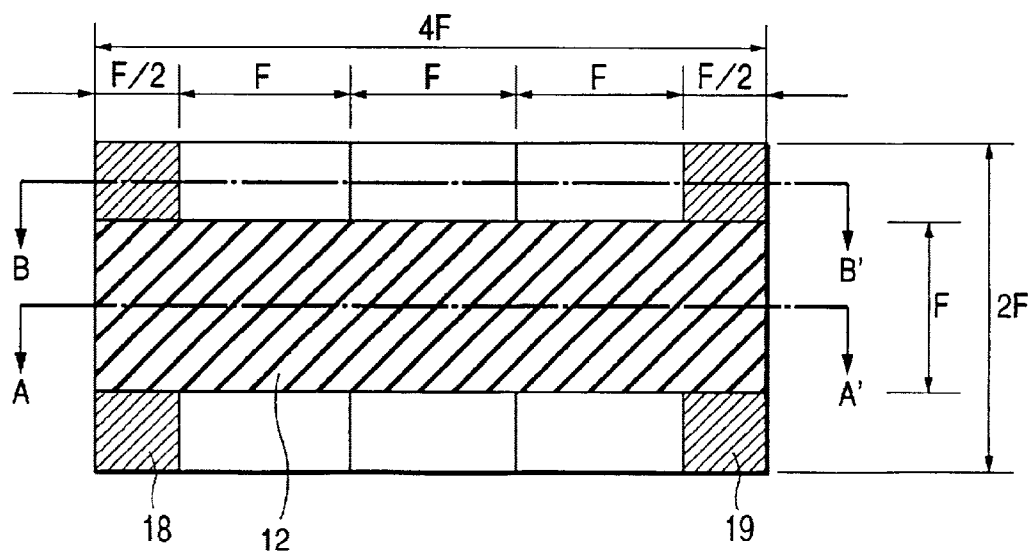
Figure 48A:
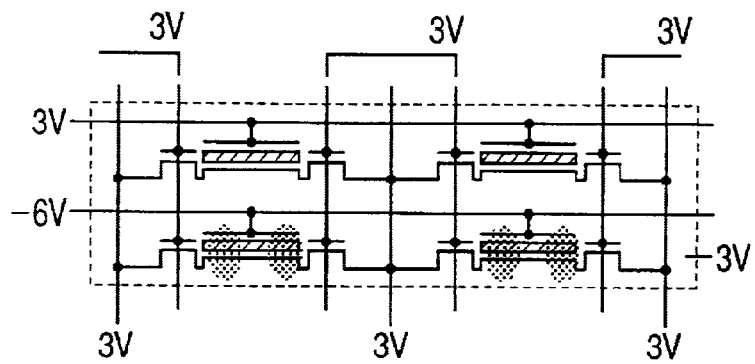
FIGS. 48(A) to 48(C) are circuit diagrams illustrating voltage-applied states at erase, write read operations for the memory cell shown in FIG. 47.
Figure 48B:
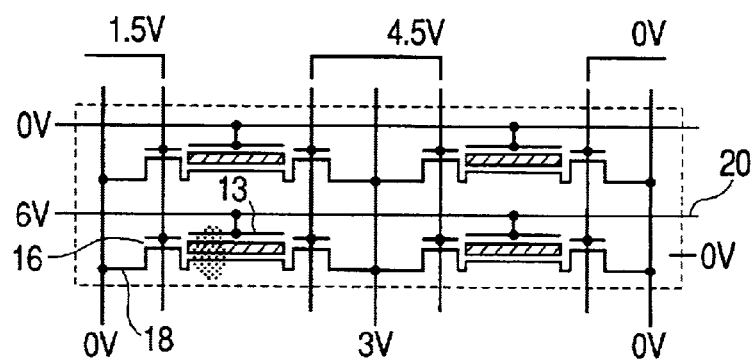
Figure 48C:
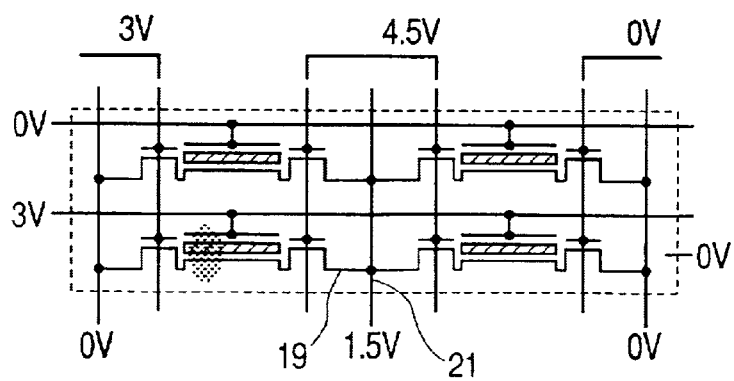

As illustrated in FIG. 42, part of built-in nonvolatile memories is used as the memory MEM, and the remaining one may be used as the nonvolatile memory 114 having the memory cells small in chip occupied area described in FIGS. 47 and 48. The structure of the memory cell described in FIGS. 47 and 48 is compatible with FIGS. 15 and 25 in manufacturing process. Owing to the configuration shown in FIG. 42, an increase in the storage capacity of each built-in nonvolatile memory can be achieved.

Figure 43:
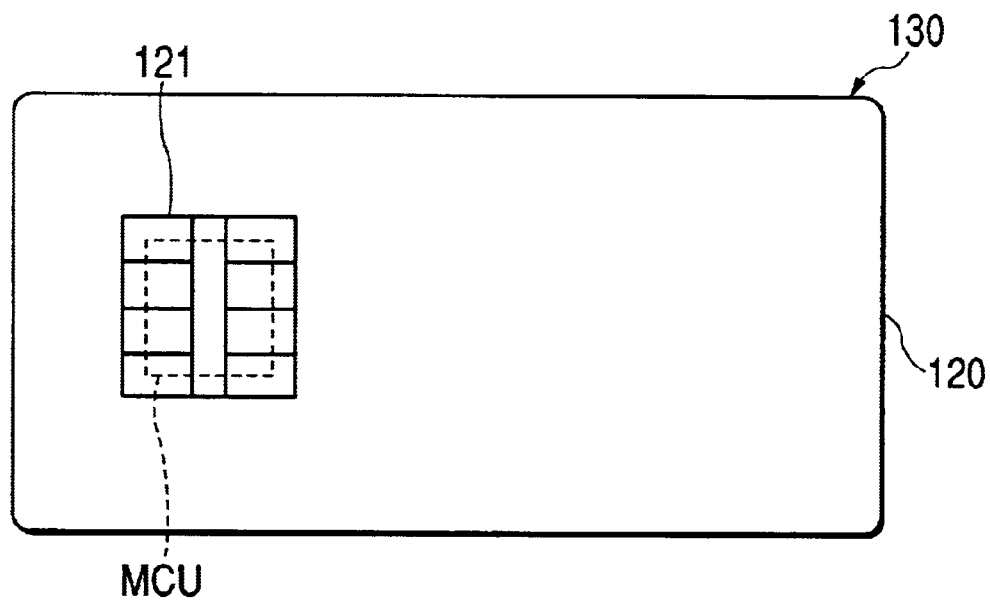
FIG. 43 is a schematic plan view illustrating a contact IC card to which the microcomputer shown in FIG. 41 or 42 is applied.

FIG. 43 shows an IC card 130 to which the microcomputer illustrated in FIG. 41 or 42 is applied. The IC card 130 shown in the same drawing is a contact IC card wherein the microcomputer MCU is embedded in a card substrate 120 made of plastic or the like, and a card interface terminal 121 connected to an interface circuit 113 of the microcomputer MCU by unillustrated card in-substrate wirings is provided so as to be exposed to the surface thereof. The card interface terminal 121 makes contact with a lead terminal provided inside an unillustrated card terminal device having a card reader, a card writer or the like so as to be used for information transfer.

Figure 44:
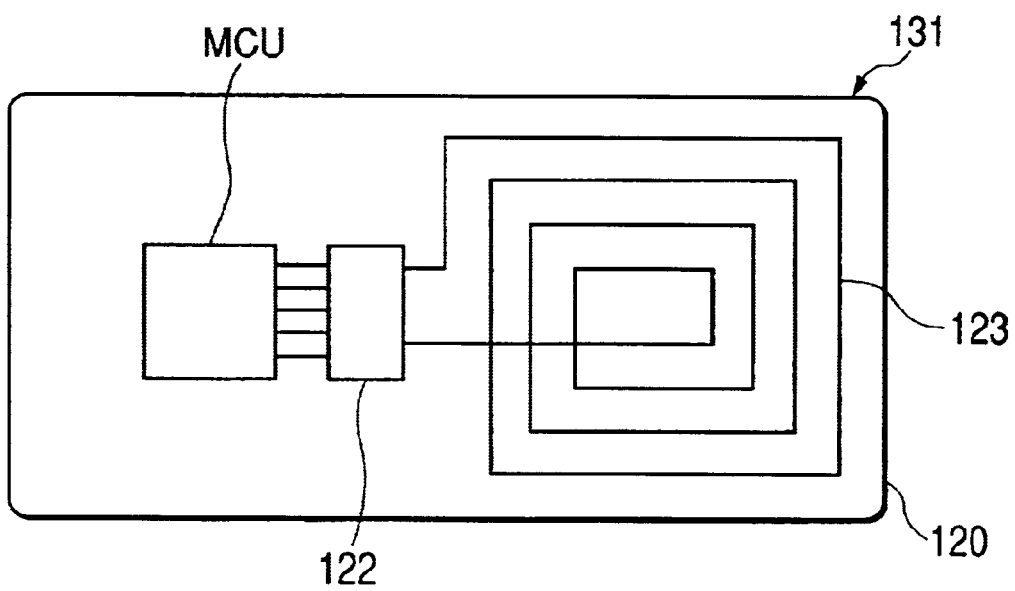
FIG. 44 is a schematic plan view illustrating a non-contact IC card to which the microcomputer illustrated in FIG. 41 or 42 is applied.
Figure 45A:
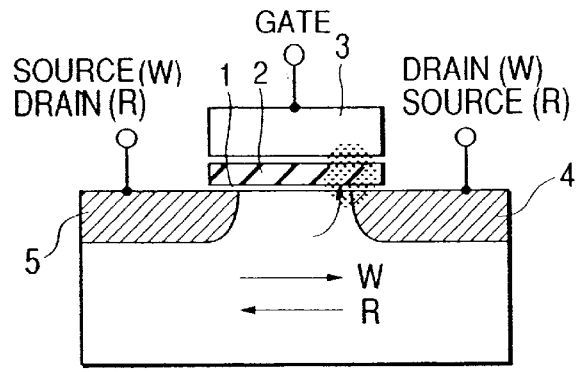
FIGS. 45(A) to 45(C) are diagrams for describing a structure of a nonvolatile memory cell of a multi-storage form having a conventional MONOS structure.
Figure 45B:
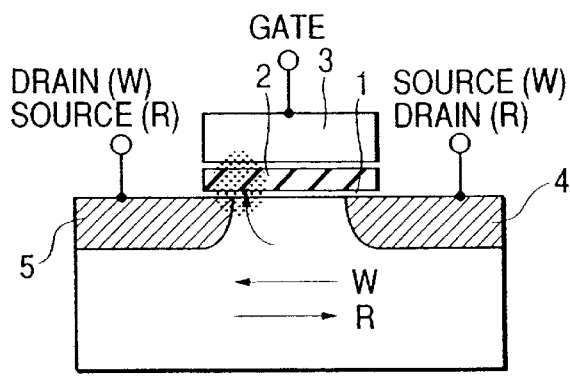
Figure 45C:
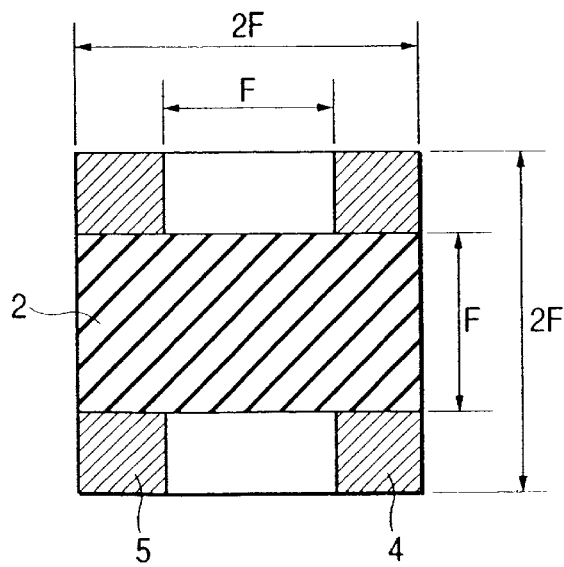
Figure 46A:
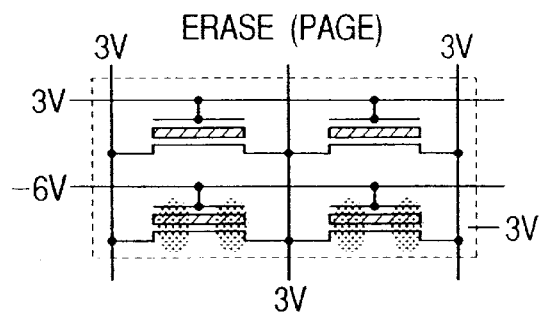
FIGS. 46(A) to 46(D) are circuit diagrams illustrating voltage-applied states at erase, write and read operations for the memory cell shown in FIG. 45.
Figure 46B:
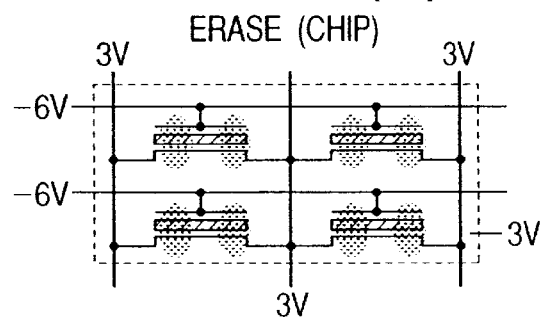
Figure 46C:
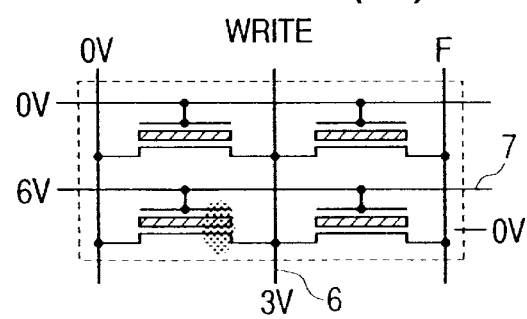
Figure 46D:
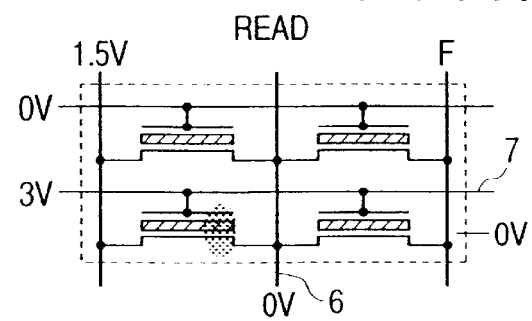

Another IC card 131 to which the microcomputer illustrated in FIG. 41 or 42 is illustrated in FIG. 44. The IC card 131 shown in the same drawing is a non-contact IC card wherein a high-frequency interface circuit 122 connected to the external interface circuit 113 of the microcomputer MCU, and an antenna 123 connected to the high-frequency interface circuit 122 are provided on a card substrate 120 made of plastic or the like in addition to the microcomputer MCU. FIG. 44 shows a state in which a surface protective cover of the card substrate 120 is being detached. The non-contact IC card is capable of performing, for example, the transmission of power by ac magnetic fields and information communications by electromagnetic induction in non-contact form. Since the nonvolatile memory MEM loaded with the memory cells MC capable of reducing the write current as described above is used from the viewpoint that the supply of power is carried out in non-contact form, the present invention is most suitable for the non-contact IC card.

While the invention made above by the present inventors has been described specifically by illustrated embodiments, the present invention is not limited to the same. It is needless to say that various changes can be made thereto within the scope not departing from the substance thereof.

For example, a nonvolatile memory cell is not limited to an n channel type and may be a p channel type. Voltage-applied states for erasure, writing and reading effected on the nonvolatile memory cell are not limited to the above. They may suitably be changed according to relationships with a device process, sizes or withstand voltages, etc. Further, the memory cell is not limited to a MONOS structure and may be an MNOS structure. In such a case, however, it is necessary to form a gate oxide film relatively thick as compared with the MONOS structure. Further, the configuration of a memory cell array is not limited to a configuration wherein the signal electrodes 38 of the adjacent memory cells share the use of the same data line as in FIG. 11 or the like, and the number of sense amplifiers is reduced. Discrete sense amplifiers may respectively be assigned to the signal electrodes 38 and 39 to perform data reading. When the application to the non-contact IC card is assumed, both power transmission and information communications may be carried out by electromagnetic induction. Only the power transmission may be performed in non-contact form.

The present invention is not limited to the application to a microcomputer for an IC card. The present invention can widely be applied to various microcomputers which need a reduction in chip occupied area or the like, another data processing LSI and a memory LSI, etc.

Advantageous effects obtained by typical ones of the inventions disclosed in the present application will be described in brief as follows:

Namely, since a nonvolatile memory cell is configured so that word lines and signal electrodes used as sources/drains extend in the same direction, rewriting based on plural bit units like byte rewriting can be implemented for a memory using memory cells of multi-storage forms.

Since writing is performed according to a source side injection system, it is possible to reduce a write current from a source side of each memory cell of a multi-storage form.

Since high-concentration impurity regions are formed at a channel portion, the channel portion is substrate-biased in the backward direction upon writing. Consequently, a write current can further be reduced and besides electrons can be prevented from being injected into an insulating film between each of switch gate electrodes and a gate nitride film from the source side, thereby making it possible to improve resistance characteristics for rewriting.

A semiconductor device like a microcomputer or a data processor most suitable for mounting onto a non-contact IC card in terms of the consumption of power by an on-chip memory cell of a multi-storage form, can be implemented.

A memory cell of a multi-storage form, which is capable of performing the byte rewriting and is excellent in resistance characteristics for rewriting, can easily be manufactured.

What is claimed is:

1. A semiconductor device comprising:
   a plurality of nonvolatile memory cells, each including,
      a memory gate electrode formed over a first semiconductor region with first and second gate insulating films interposed therebetween;
      first and second switch gate electrodes formed over the first semiconductor region lying on both sides of the memory gate electrode with a third interlayer insulating film interposed therebetween; and
      first and second signal electrodes each used a source or drain electrode, which are formed in the first semiconductor region lying in the neighborhood below the respective first and second switch gate electrodes;
   wherein the memory gate electrode and the first and second switch gate electrodes respectively extend in a first direction, the first and second signal electrodes respectively have first and second signal wirings which are connected thereto and extend in a second direction substantially orthogonal to the first direction, and the first and second signal wirings are shared between a plurality of nonvolatile memory cells arranged in parallel in the second direction, and the memory gate electrode and the first and second switch gate electrodes are shared between a plurality of nonvolatile memory cells arranged in parallel in the first direction.

2. The semiconductor device according to claim 1, wherein a pair of the nonvolatile memory cells which are adjacent in the first direction and which share the use of a said memory gate electrode, is configured so that either one of the first and second signal electrodes thereof is used in common and the others thereof are individualized, and the first and second signal electrodes thereof are connected to their corresponding first and second signal wirings.

3. The semiconductor device according to claim 2, wherein the first semiconductor region is a well region, a plurality of the nonvolatile memory cells, which share the use of a said memory gate electrode and respective first and second switch gate electrodes, are disposed in a plurality of electrically separated well regions in divided form, and each of such nonvolatile memory cells discharges carriers from the second gate insulating film to the corresponding electrically-separated well region according to a difference in potential between the corresponding electrically-separated well region and the memory gate electrode.

4. The semiconductor device according to claim 2, wherein an individual nonvolatile memory cell discharges carriers from the second gate insulating film to the first semiconductor region according to a difference in potential between the first or second signal electrode selected by the first or second switch gate electrode thereof and the first semiconductor region.

5. The semiconductor device according to claim 2, wherein an individual nonvolatile memory cell discharges carriers from the second insulating film to the memory gate electrode according to a difference in potential between the corresponding first or second signal electrode selected by the first or second switch gate electrode and the corresponding memory gate electrode.

6. The semiconductor device according to claim 2, wherein an individual nonvolatile memory cell stores 2-bit information therein according to a first state in which carriers are captured on the first switch gate electrode side of the second gate insulating film, a second state in which the carriers captured in the first state are reduced, a third state in which carriers are captured on the second switch gate electrode side of the second gate insulating film, or a fourth state in which the carriers captured in the third state are reduced.

7. The semiconductor device according to claim 6, wherein when a potential at the second signal electrode selected by the second switch gate electrode is set higher than a potential at the first signal electrode selected by the first switch gate electrode, the nonvolatile memory cell reads 1-bit storage information placed in the first or second state, and when a potential at the first signal electrode selected by the first switch gate electrode is set higher than a potential at the second signal electrode selected by the second switch gate electrode, the nonvolatile memory cell reads 1-bit storage information placed in the third or fourth state.

8. The semiconductor device according to claim 2, wherein high-concentration impurity regions are respectively formed in the first semiconductor region placed below the first and second gate insulating films with widths less than or equal to width sizes of the corresponding first and second gate insulating films.

9. The semiconductor device to claim 8, wherein when carriers are captured on the first switch gate electrode side or second switch gate electrode side of the second gate insulating film, the first semiconductor region is supplied with a backward substrate bias voltage.

10. A semiconductor device comprising:
a plurality of nonvolatile memory cells, each including,
a memory gate electrode formed over a first semiconductor region with first and second gate insulating films interposed therebetween;
first and second switch gate electrodes formed over the first semiconductor region lying on both sides of the memory gate electrode with a third interlayer insulating film interposed therebetween; and
first and second signal electrodes each used a source or drain electrode, which are formed in the first semiconductor region lying in the neighborhood below the respective first and second switch gate electrodes;
wherein the memory gate electrode and the first and second switch gate electrodes respectively extend in a first direction, a first signal wiring is connected to the first signal electrode of the nonvolatile memory cell, a second signal wiring is connected to the second signal electrode of the nonvolatile memory cell, and
further including a precharge circuit capable of precharging the first signal wiring and the second signal wiring, a sense amplifier which detects a change in the level of the first signal wiring, and a control circuit, and
wherein the control circuit allows the precharge circuit to perform a precharge operation so that either one of the first and second signal electrodes and the other thereof are respectively brought to a high potential and a low potential according to a read address and causes the sense amplifier to detect the presence or absence of a change in the level of the first signal wiring after the completion of the precharge operation.

11. A semiconductor device comprising:
a plurality of nonvolatile memory cells provided in a first semiconductor region formed on a semiconductor substrate,
said each nonvolatile memory cell including,
first and second gate insulating films laminated on the first semiconductor region;
a memory gate electrode formed over the first and second gate insulating films;
first and second switch gate electrodes formed over the first semiconductor region lying on both sides of the memory gate electrode with third gate insulating films interposed therebetween; and
first and second signal electrodes each used a source or drain electrode, which are formed in the first semiconductor region lying in the neighborhood below the respective first and second switch gate electrodes;
wherein the second gate insulating film comprises silicon nitride;
wherein the memory gate electrode comprises polycrystalline silicon corresponding to a first layer;
wherein the first and second switch gate electrodes respectively comprise polycrystalline silicon corresponding to a second layer;
wherein the memory gate electrode and the first and second switch gate electrodes extend in a first direction; and
wherein first and second signal wirings respectively connected with the first and second signal electrodes extend in a second direction substantially orthogonal to the first direction.

12. A semiconductor device comprising:
a plurality of nonvolatile memory cells provided in a first semiconductor region formed on a semiconductor substrate,
said each nonvolatile memory cell including,
first and second gate insulating films laminated on the first semiconductor region;
a memory gate electrode formed over the first and second gate insulating films;
first and second switch gate electrodes formed over the first semiconductor region lying on both sides of the memory gate electrode with third gate insulating films interposed therebetween; and
first and second signal electrodes each used a source or drain electrode, which are formed in the first semiconductor region lying in the neighborhood below the respective first and second switch gate electrodes;
wherein the second gate insulating film comprises silicon nitride;
wherein the first and second switch gate electrodes respectively comprise polycrystalline silicon corresponding to a first layer;
wherein the memory gate electrode comprises polycrystalline silicon corresponding to a second layer;
wherein the memory gate electrode and the first and second switch gate electrodes extend in a first direction; and
wherein first and second signal wirings respectively connected with the first and second signal electrodes extend in a second direction substantially orthogonal to the first direction.

13. The semiconductor device according to claim 12, wherein a memory circuit provided with the nonvolatile memory cells as storage elements, a CPU capable of accessing the memory circuit, and an external interface circuit connected to the CPU are provided on a single semiconductor chip.

14. An IC card comprising:

a card substrate;

a semiconductor device according to claim 14; and a card interface terminal connected to the external interface circuit of the semiconductor device, all of which being provided on the card substrate.

15. An IC card comprising:

a card substrate;

a semiconductor device according to claim 13;

a high-frequency interface circuit connected to the external interface circuit of the semiconductor device; and an antenna connected to the high-frequency interface circuit, all of which being provided on the card substrate.

\* \* \* \* \*